US012365580B2

United States Patent
Zou et al.

(10) Patent No.: US 12,365,580 B2
(45) Date of Patent: Jul. 22, 2025

(54) COMPACT ENHANCED SENSITIVITY TEMPERATURE SENSOR USING AN ENCAPSULATED CLAMPED-CLAMPED MEMS BEAM RESONATOR

(71) Applicants: KING FAHD UNIVERSITY OF PETROLEUM AND MINERALS, Dhahran (SA); King Abdullah University of Science and Technology, Thuwal (SA)

(72) Inventors: Xuecui Zou, Thuwal (SA); Sally Ahmed, Giza (EG); Hossein Fariborzi, Thuwal (SA); Nizar Jaber, Dhahran (SA)

(73) Assignees: KING FAHD UNIVERSITY OF PETROLEUM AND MINERALS, Dhahran (SA); King Abdullah University of Science and Technology, Thuwal (SA)

( * ) Notice: Subject to any disclaimer, the term of this patent is extended or adjusted under 35 U.S.C. 154(b) by 448 days.

(21) Appl. No.: 18/153,795

(22) Filed: Jan. 12, 2023

(65) Prior Publication Data
US 2023/0219804 A1 Jul. 13, 2023

Related U.S. Application Data

(60) Provisional application No. 63/298,727, filed on Jan. 12, 2022.

(51) Int. Cl.
*B81B 3/00* (2006.01)
*B81C 1/00* (2006.01)

(52) U.S. Cl.
CPC ........ *B81B 3/0021* (2013.01); *B81C 1/00158* (2013.01); *B81B 2201/0278* (2013.01);
(Continued)

(58) Field of Classification Search
CPC ......... B81B 3/0021; B81B 2201/0278; B81B 2203/0127; B81B 2203/0307;
(Continued)

(56) References Cited

U.S. PATENT DOCUMENTS

2011/0150031 A1* 6/2011 Abdelmoneum ........ G01K 7/32
374/117
2012/0188023 A1 7/2012 Rottenberg et al.
(Continued)

FOREIGN PATENT DOCUMENTS

WO WO 2016/108771 A1 7/2016

OTHER PUBLICATIONS

Ya Zhang, et al., "Thermal tuning of mechanical nonlinearity in GaAs doubly-clamped MEMS beam resonators", Applied Physics Letters, vol. 119, Issue 16, 2021, 4 pages (Abstract only).
(Continued)

*Primary Examiner* — Moazzam Hossain
(74) *Attorney, Agent, or Firm* — Oblon, McClelland, Maier & Neustadt, L.L.P.

(57) ABSTRACT

A MEMS temperature sensor including a clamped-clamped microbeam having a drive electrode on one side configured for applying an AC current, and a sense electrode diagonally situated on the other side, a first anchor at one end and a second anchor at the other end of the microbeam. The first anchor receive a DC bias currents, which heats the microbeam to an operating temperature. The sense electrode is configured to capacitively sense oscillations in the microbeam due to an applied AC current. The MEMS temperature sensor has a three wafer construction in which the components are formed. The device is encapsulated by aluminum, and metal wires connect the first and second anchor, the drive electrode and the sense electrode to side electrode pads
(Continued)

outside of the encapsulation. The MEMS temperature sensor has a linear operating region of 30-60 degrees Celsius.

20 Claims, 28 Drawing Sheets

(52) U.S. Cl.
CPC .......... *B81B 2203/0127* (2013.01); *B81B 2203/0307* (2013.01); *B81B 2203/0315* (2013.01); *B81B 2203/04* (2013.01); *B81B 2207/017* (2013.01); *B81C 2201/0156* (2013.01); *B81C 2201/0188* (2013.01)

(58) Field of Classification Search
CPC ........ B81B 2203/0315; B81B 2203/04; B81B 2207/017; G01K 7/32; G01K 5/48; G01P 15/097; G01P 15/125; B81C 1/00158; B81C 2201/0156; B81C 2201/0188
See application file for complete search history.

(56) References Cited

U.S. PATENT DOCUMENTS

| | | | |
|---|---|---|---|
| 2016/0341762 A1* | 11/2016 | Waters | G01P 15/125 |
| 2017/0038265 A1 | 2/2017 | Abdelmoneum et al. | |
| 2019/0131952 A1* | 5/2019 | Valzasina | H03H 9/02259 |
| 2021/0055264 A1 | 2/2021 | Jaber et al. | |
| 2023/0048120 A1* | 2/2023 | Nakamura | G01P 15/097 |

OTHER PUBLICATIONS

R. Mahameed, et al., "Fully monolithic MEMS based thermal sensor in 22 nm CMOS technology for SoC thermal management", IEEE 2013 Transducers & Eurosensors XXVII: The 17th International Conference on Solid-State Sensors, Actuators and Microsystems (Transducers & Eurosensors XXVII), Jun. 16-20, 2013, pp. 734-737 (Abstract only).

* cited by examiner

COMPACT ENHANCED SENSITIVITY TEMPERATURE SENSOR USING AN ENCAPSULATED CLAMPED-CLAMPED MEMS BEAM RESONATOR

CROSS REFERENCE TO RELATED APPLICATIONS

The present application claims the benefit of priority to U.S. Prov. App. No. 63/298,727, entitled "Compact Enhanced Sensitivity Temperature Sensor Using An Encapsulated Clamped-Clamped Mems Beam Resonator", filed on Jan. 12, 2022, and incorporated herein by reference in its entirety.

BACKGROUND

Technical Field

The present disclosure is directed to a micro-electrical-mechanical (MEMS) temperature sensor, a method of making the MEMS temperature sensor, and a method of using the MEMS temperature sensor.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Micro-electrical-mechanical (MEMS) systems have been developed and implemented in a wide range of applications due to their desirable features, such as low cost, low power consumption, small size, high immunity against noise, and compatibility with complementary metal-oxide semiconductor (CMOS) technology. MEMS-based resonators have recently become core elements in various applications, such as mass sensing, gas detection, flowmeters, pressure recording, and temperature monitoring. Temperature monitoring is essential in many manufacturing processes, such as environment monitoring, structural safety protection, agriculture, and food inspection. Several studies have demonstrated the effectiveness of different MEMS resonator-based temperature sensors based on temperature-induced deformation or frequency-shift effect. Sensor responsivity or temperature coefficient of frequency (TCF) is a key feature that characterizes the thermal drift of resonant devices. The TCF is a ratio of the temperature-induced frequency shift to a reference frequency, which describes the sensitivity of resonant devices to temperature variations. When the temperature varies, the resonance frequency shifts due to thermal-induced deformation, elasticity change and stress. Conventional MEMS-based temperature sensors which employ CMOS compatible materials such as silicon, aluminium nitride (AlN), and gallium nitride (GaN), typically suffer from a low TCF value of less than 35 ppm/° C. As a result, the conventional MEMS based temperature sensors are inadequate for highly sensitive temperature sensing applications.

Various techniques have been developed to improve the sensitivity of these temperature sensors. Such conventional techniques include material composition technique, mode tuning technique, and stress controlling technique (either by geometry optimization or by stress engineering during device fabrication). The material composition technique increases the TCF of a device using multiple materials with different coefficients of thermal expansion (CTEs). Different approaches have been employed such as fabricating a structure composed of different materials, modifying the doping level in device materials, and fabricating the device on a substrate with a considerably high CTE difference. However, these devices still suffer from a limited TCF value of less than 140 ppm/° C. The mode tuning technique relies on different temperature coefficients of elasticity of different resonant modes. This results in different TCF values such as 149 ppm/° C., 109 ppm/° C., and 53 ppm/° C. However, the TCF values of these devices are still relatively low. Additionally, these devices face challenges with material orientation requirements, complicated fabrication processes, low reliability, and large device footprint, which further limit their utilization in practical scenarios. The stress controlling technique for increasing TCF involves modulating the stress on the device, such as changing the initial stress or modifying the geometric factor to enhance the thermally induced stress. These devices have a higher TCF than those of the previous two techniques, as ~400-600 ppm/° C., and the highest TCF has been reported to be ~780 ppm/° C. However, these devices suffer from a large footprint and require an optical readout equipment which limits their practical application. Further, these devices suffer from design complexity and low sensitivity. Various exemplary conventional references are listed below including conventional MEMS-based temperature sensors. A conventional dual functionality metamaterial was described (See: J. Tao et al., "*Dual functionality metamaterial enables ultra-compact, highly sensitive uncooled infrared sensor*," Nanophotonics, vol. 10, no. 4, pp. 1337-1346, February 2021, doi: 10.1515/nanoph-2020-0607, incorporated herein by reference in its entirety). Infrared detectors for temperature measurement were described (See: X. Li et al., "*Resonant and resistive dual-mode uncooled infrared detectors toward expanded dynamic range and high linearity*," Appl. Phys. Lett., vol. 110, no. 26, June 2017, Art. no. 263502, doi: 10.1063/1.4990285, incorporated herein by reference in its entirety). A micromechanical resonator was described (See: H. Zhu, C. Tu, G. Shan, and J. E.-Y. Lee, "*Dependence of temperature coefficient of frequency (TCf) on crystallography and eigenmode in N-doped silicon contour mode micromechanical resonators*," Sensors Actuators A, Phys., vol. 215, pp. 189-196, August 2014, incorporated herein by reference in its entirety). An IR-based sensor was described (See: M. Moosavifar, A. Ansari, and M. Rais-Zadeh, "*An AlN-on-Si resonant IR sensor array with a large temperature coefficient of frequency*," in Proc. IEEE SENSORS, November 2016, pp. 1-3, incorporated herein by reference in its entirety). Plate wave sensors for temperature measurment was described (See: M. Reusch, K. Holc, V. Lebedev, N. Kurz, A. ukauskaite, and O. Ambacher, "*Temperature cross-sensitivity of AlN-based flexural plate wave sensors*," IEEE Sensors J., vol. 18, no. 19, pp. 7810-7818, October 2018, incorporated herein by reference in its entirety). A conventional MEMS temperature sensor was described (See: T. Kose, K. Azgin, and T. Akin, "*Design and fabrication of a high performance resonant MEMS temperature sensor*," J. Micromech. Microeng., vol. 26, no. 4, April 2016, Art. no. 045012, doi: 10.1088/0960- 1317/26/4/045012, incorporated herein by reference in its entirety). Torsional resonators were described (See: X. C. Zhang, E. B. Myers, J. E. Sader, and M. L. Roukes, "*Nanomechanical torsional resonators for frequency-shift infrared thermal sensing*," Nano Lett., vol. 13, no. 4, pp. 1528-1534, April 10, 2013, doi:

10.1021/nl304687p, incorporated herein by reference in its entirety). String-based temperature sensors were described (See: T. Larsen et al., "*Ultrasensitive string-based temperature sensors*," Appl. Phys. Lett., vol. 98, no. 12, March 2011, Art. no. 121901, doi: 10.1063/1.3567012, incorporated herein by reference in its entirety). A SAW temperature sensor was described (See: L. Li et al., "*A novel design method for SAW temperature sensor with monotonic and linear frequency-temperature behavior in wide temperature range*," Sensors Actuators A, Phys., vol. 307, June 2020, Art. no. 111982, doi: 10.1016/j.sna.2020.111982, incorporated herein by reference in its entirety). Dual MEMS resonator was described (See: H. Campanella, M. Narducci, S. Merugu, and N. Singh, "*Dual MEMS resonator structure for temperature sensor applications*," IEEE Trans. Electron. Devices, vol. 64, no. 8, pp. 3368-3376, August 2017, incorporated herein by reference in its entirety). Another conventional infrared detectors for temperature measurement were described (See: V. J. Gokhale and M. Rais-Zadeh, "*Uncooled infrared detectors using gallium nitride on silicon micromechanical resonators*," J. Microelectro-mech. Syst., vol. 23, no. 4, pp. 803-810, August 2014, incorporated herein by reference in its entirety). Another conventional micromechanical resonator for temperature measurement was described (See: A. Cagliani, V. Pini, J. Tamayo, M. Calleja, and Z. J. Davis, "*Ultra-sensitive thermometer for atmospheric pressure operation based on a micromechanical resonator*," Sensors Actuators B, Chem., vol. 202, pp. 339-345, October 2014, doi:0.1016/j.snb.2014.05.076, incorporated herein by reference in its entirety). Using temperature dependency of resonator was described (See: M. A. Hoperoft et al., "*Using the temperature dependence of resonator quality factor as a thermometer*," Appl. Phys. Lett., vol. 91, no. 1, July 2007, Art. no. 013505, doi:10.1063/1.2753758, incorporated herein by reference in its entirety). A microresonator used a temperature was described (See: C. M. Jha et al., "*High resolution microresonator-based digital temperature sensor*," Appl. Phys. Lett., vol. 91, no. 7, August 2007, Art. no. 074101, incorporated herein by reference in its entirety). The aforementioned references provide a range of TCF from 50 ppm/° C. to 800 ppm/° C., indicating lack of sensitivity.

Accordingly, it is one object of the present disclosure to provide a MEMS temperature sensor having high-TCF, small-footprint, and a readout circuit which does not interfere with the operation of the sensor.

SUMMARY

In an exemplary embodiment, a micro-electrical-mechanical (MEMS) temperature sensor is described. The MEMS temperature sensor includes a cavity wafer configured with an air cavity region, where the air cavity region is configured with cavity sides and a bottom surface. The MEMS temperature sensor also includes a metal layer located on the bottom surface of the air cavity region and a membrane wafer located over the cavity wafer. The membrane wafer is configured with a microbeam. The microbeam has a first end and a second end, where the microbeam is located over the air cavity region. The membrane wafer includes a first anchor attached to the first end, a second anchor attached to the second end, a drive electrode located on a substrate on a first side of the microbeam near the first end, a sense electrode located on the substrate at a second side of the microbeam near the second end, a first ground electrode adjacent to the drive electrode on the first side near the second end, a second ground electrode adjacent to the sense electrode on the second side near the first end, a first metallic feed line connected at a first terminal to the drive electrode and at a second terminal to a first side electrode pad, a second metallic feed line connected at a first terminal to the first anchor and at a second terminal to a second side electrode pad, a third metallic feed line connected at a first terminal to the second ground electrode and at a second terminal to a third side electrode pad, a fourth metallic feed line connected to a fourth side electrode pad, a fifth metallic feed line connected at a first terminal to the sense electrode and at a second terminal to a fifth side electrode pad, a sixth metallic feed line connected at a first terminal to the second anchor and at a second terminal to a sixth side electrode pad, and a seventh metallic feed line connected at the first terminal to the second ground electrode and at a second terminal to a seventh side electrode pad, where each of the side electrode pads are adjacent to one another and parallel to the microbeam. The MEMS temperature sensor also includes a capping wafer located over and encapsulating the cavity wafer and membrane wafer, where the side electrode pads are exposed. The MEMS temperature sensor includes an aluminum layer configured to cover periphery of the MEMS temperature sensor, while leaving the side electrode pads exposed, and an alternating current (AC) source connected to the first side electrode pad. Also, the MEMS temperature sensor includes a DC bias voltage source connected to the second side electrode pad and a ground connected to the third side electrode pad, the fourth side electrode pad, the sixth side electrode pad and the seventh side electrode pad, where the microbeam is configured to vibrate at a resonant frequency related to a temperature surrounding the MEMS temperature sensor when an AC current is applied to the drive electrode and a DC bias voltage is applied to the first anchor, and where the sense electrode is configured to capacitively sense the vibration and generate an induced current based on the resonant frequency. The membrane wafer also includes a multimeter connected to the fifth side electrode pad, where the multimeter is configured to measure the induced current, and a computing device connected to the multimeter. The computing device is configured with a display and a database including records relating induced current values to temperature values, where the computing device is configured to search the database to match the induced current to a temperature value and display the temperature value on the display.

In another exemplary embodiment, a method of using a MEMS temperature sensor is described. The method includes applying, by an alternating current (AC) source, a fixed frequency alternating current (AC) to a drive electrode, and applying, by a DC bias voltage source, a DC bias voltage to a first anchor of a microbeam. The method includes connecting a ground to a second anchor of the microbeam, to a first ground electrode adjacent to the drive electrode, to a second ground electrode adjacent to a sense electrode, to a substrate of the MEMS temperature sensor and to an aluminum layer encapsulating the MEMS temperature sensor. The method includes measuring, by a multimeter, an induced current at the sense electrode over a frequency range. The method also includes receiving, by a computing device connected to the multimeter, the induced current, and determining, by the computing device, a resonant frequency of the induced current based on a magnitude of the induced current. The method includes searching, by the computing device, a database containing records induced current values at each resonant frequency to temperature values, matching the induced current and determined resonant frequency to a temperature value, and displaying, on a display, the temperature value.

In yet another exemplary embodiment, a method of making a MEMS temperature sensor is described. The method includes depositing a cavity wafer on a substrate, and etching, by lithographic etching, an air cavity region into the cavity wafer, where the air cavity region is configured with cavity sides and a bottom surface. The method includes masking and depositing, by electronic vapor deposition, a metal on the bottom surface. Also, the method includes removing the mask, depositing a membrane wafer on the cavity wafer, depositing a layer of silicon dioxide over the membrane wafer, performing an isotropic etch process to form rectangular walls around an area of the membrane wafer while masking the membrane wafer, and forming, by lithographic etching, a microbeam in the membrane wafer over the air cavity region. The method includes forming, by etching, a first anchor at a first end of the microbeam and a second anchor at a second end of the microbeam, forming a masking pattern over the membrane wafer, and depositing, by electronic vapor deposition of aluminum, a drive electrode on a first side of the microbeam, a first ground electrode on the first side of the microbeam, a sense electrode on a second side of the microbeam, a second ground electrode on the second side of the microbeam, a first anchor electrode on the first anchor, and a second anchor electrode on the second anchor. The method also includes depositing, by electronic vapor deposition of aluminum, a plurality of side electrode pads in a region of the membrane wafer which is outside of the rectangular walls, and depositing, by electronic vapor deposition of aluminum, a wiring pattern of metallic feed lines on the membrane wafer within the area surrounding the rectangular walls, where the metallic feed lines are configured to connect each of the drive electrode, the first ground electrode, the sense electrode, the second ground electrode, the first anchor electrode, and the second anchor electrode to a respective side electrode pad. The method includes removing the masking pattern, encapsulating rectangular walls, the membrane wafer and the cavity wafer with a capping wafer, while masking the side electrode pads, encapsulating the capping wafer with an aluminum layer, and removing the masking from the side electrode pads.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
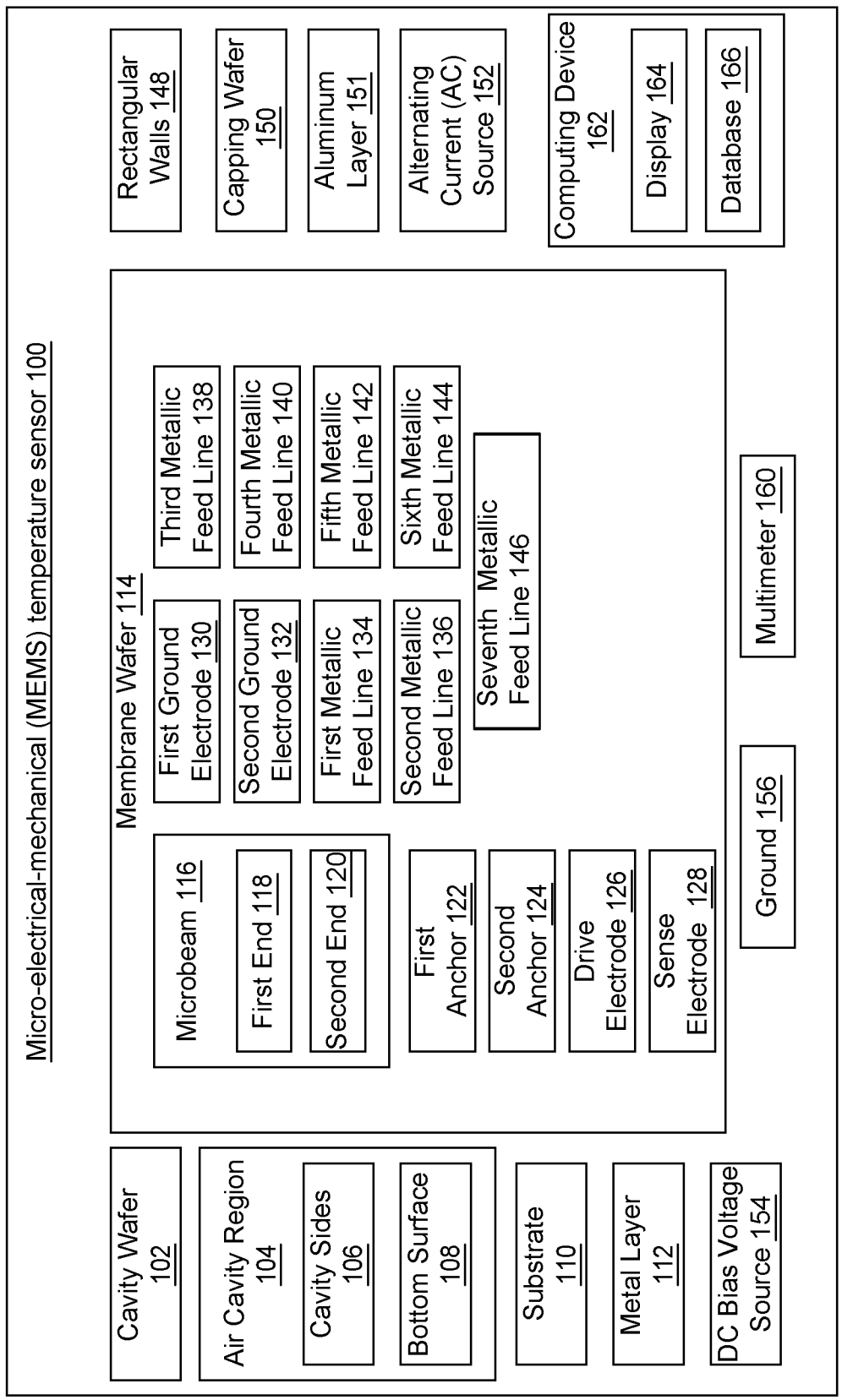
FIG. 1 shows a block diagram of a micro-electrical-mechanical (MEMS) temperature sensor, according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Also, it should be noted that, as used herein, the singular form of terms includes the corresponding plural form, unless the context clearly indicates otherwise. Thus, for example, reference to "wall" refers to one or more walls. In addition, it should be understood that terms such as "bottom", "located on", "located over", "located below", "side", "end", "height", "length", "width", "above", "below", "inside", "outside", "adjacent", "parallel", "first", "second", "third", "fourth", "fifth", "sixth", "seven", "region", "within" which may be used herein, are merely indicative and do not necessarily limit the embodiments of the disclosure to any particular orientation or configuration.

Aspects of this disclosure are directed to a micro-electrical-mechanical (MEMS) temperature sensor, a method of making the MEMS temperature sensor, and a method of using the MEMS temperature sensor.

FIG. 1 shows a block diagram of a MEMS temperature sensor 100, according to certain embodiments.

According to aspects of the present disclosure, the MEMS temperature sensor 100 is a resonator based temperature sensor. In examples, the MEMS temperature sensor 100 may also be interchangably referred to as a clamped-clamped MEMS beam resonator 100 or a doubly-clamped MEMS beam resonator 100. The dimensions of the MEMS temperature sensor 100 may be a length of about 3 mm, a width of about 2 mm, and a height of about 1 mm.

The MEMS temperature sensor 100 includes a cavity wafer 102. The cavity wafer 102 is configured with an air cavity region 104. The air cavity region 104 is configured with cavity sides 106 and a bottom surface 108. In examples, the air cavity region 104 may be about 50 microns deep. The MEMS temperature sensor 100 includes a substrate 110. The substrate 110 is located below the cavity wafer 102. The MEMS temperature sensor 100 also includes a metal layer 112. The metal layer 112 is located on the bottom surface 108 of the air cavity region 104.

The MEMS temperature sensor 100 also includes a membrane wafer 114 located over the cavity wafer 102. The membrane wafer 114 is configured with a microbeam 116. In examples, the microbeam 116 may have a length of about 300 microns, a width of about 2 microns, and a thickness of about 30 microns. The microbeam 116 has a first end 118 and a second end 120. The microbeam 116 is located over the air cavity region 104. The membrane wafer 114 is configured with a first anchor 122 and a second anchor 124. The first anchor 122 and the second anchor 124 are referred to as beam anchors. The first anchor 122 is attached to the first end 118 and the second anchor 124 is attached to the second end 120. The membrane wafer 114 is also configured with a drive electrode 126, a sense electrode 128, a first ground electrode 130, a second ground electrode 132, a first metallic feed line 134, a second metallic feed line 136, a third metallic feed line 138, a fourth metallic feed line 140, a fifth metallic feed line 142, a sixth metallic feed line 144, and a seventh metallic feed line 146.

The drive electrode 126 is located on the cavity wafer 102 on a first side of the microbeam 116 near the first end 118. The sense electrode 128 is located on the cavity wafer 102 at a second side of the microbeam 116 near the second end 120. The substrate 110 is connected to the fourth side electrode pad. The first ground electrode 130 is located adjacent to the drive electrode 126 on the first side near the second end 120. The second ground electrode 132 is located adjacent to the sense electrode 128 on the second side near the first end 118. In examples, each of the drive electrode 126, the sense electrode 128, the first ground electrode 130, and the second ground electrode 132 is spaced about 2 microns from the microbeam 116 and from each other.

The first metallic feed line 134 is connected at a first terminal to the drive electrode 126 and at a second terminal to a first side electrode pad. The second metallic feed line 136 is connected at a first terminal to the first anchor 122 and at a second terminal to a second side electrode pad. The third metallic feed line 138 is connected at a first terminal to the second ground electrode 132 and at a second terminal to a third side electrode pad. The fourth metallic feed line 140 is connected to a fourth side electrode pad. The fifth metallic feed line 142 is connected at a first terminal to the sense electrode 128 and at a second terminal to a fifth side electrode pad. Also, the sixth metallic feed line 144 is connected at a first terminal to the second anchor 124 and at a second terminal to a sixth side electrode pad. The seventh metallic feed line 146 connected at the first terminal to the second ground electrode 132 and at a second terminal to a seventh side electrode pad. Also, each of the side electrode pads is adjacent to one another and parallel to the microbeam 116.

The MEMS temperature sensor 100 further includes a rectangular wall 148 (interchangeably referred to as rectangular walls 148). The rectangular wall 148 is located on the membrane wafer 114. The rectangular wall 148 is configured to surround the microbeam 116, the first anchor 122, the second anchor 124, the drive electrode 126, the sense electrode 128, the first ground electrode 130, and the second ground electrode 132. A portion of the rectangular wall 148 adjacent to the first side electrode pad, the second side electrode pad, the third side electrode pad and the fourth side electrode pad includes a plurality of vias configured to pass the first metallic feed line 134, the second metallic feed line 136, the third metallic feed line 138, and the fourth metallic feed line 140, respectively, through the portion of the rectangular wall 148. The rectangular wall 148 is etched from a layer of silicon dioxide deposited on the membrane wafer 114 before the membrane wafer 114 is configured.

The MEMS temperature sensor 100 also includes a capping wafer 150. The capping wafer 150 is located over and encapsulates the cavity wafer 102 and the membrane wafer 114, where the side electrode pads are exposed. The capping wafer 150 may be configured to vacuum encapsulate the rectangular wall 148 and the membrane wafer 114.

The MEMS temperature sensor 100 includes an aluminum layer 151. The aluminum layer 151 is configured to cover the periphery of the MEMS temperature sensor 100, while leaving the side electrode pads exposed. The aluminum layer 151 may be connected to the fourth side electrode pad. The MEMS temperature sensor 100 also includes an alternating current (AC) source 152, a direct current (DC) bias voltage source 154, and a ground 156. The AC source 152 is connected to the first side electrode pad. The DC bias voltage source 154 is connected to the second side electrode pad, and the ground 156 is connected to the third side electrode pad, the fourth side electrode pad, the sixth side electrode pad, and the seventh side electrode pad. The microbeam 116 is configured to vibrate at a resonant frequency related to a temperature surrounding the MEMS temperature sensor 100 when an AC current (also referred to as AC drive current or AC drive signal) is applied to the drive electrode 126 and a DC bias voltage is applied to the first anchor 122. In an example, the DC bias voltage may be about 20 volts, and the AC current may be applied at −32 dBm and with a fixed frequency. The sense electrode 128 is configured to capacitively sense the vibration of the microbeam 116 and generate an induced current based on the resonant frequency. In examples, a relationship between the induced current and the temperature is linear within a temperature range of about 30 degree Celsius to 60 degree Celsius. The resonant frequency is inversely proportional to the temperature.

The MEMS temperature sensor 100 also includes a multimeter 160 and a computing device 162. The computing device 162 includes a display 164 and a database 166. The multimeter 160 is connected to the fifth side electrode pad. The multimeter 160 is configured to measure the induced current. The computing device 162 is connected to the multimeter 160. The database 166 of the computing device 162 includes records relating induced current values to temperature values. The computing device 162 is configured to search the database 166 to match the induced current to a temperature value and display the temperature value on the display 164.

Examples by which the MEMS temperature sensor 100 may be made or fabricated are described below.

The MEMS temperature sensor 100 is fabricated using XMB10 surface-micromachined capacitive 3D MEMS fabrication process (built by X-FAB Semiconductor Foundries GmbH, Haarbergstr. 67, 99097 Erfurt, Germany). There are multiple materials of different CTE properties used in the fabrication of the MEMS temperature sensor 100.

The cavity wafer 102 may be deposited on the substrate 110. The air cavity region 104 may be etched into the cavity wafer 102, to a depth of about 50 μm deep using deep reactive iron etching. In an example, a mask may be applied to the cavity wafer and lithographic etching may be used to etch the air cavity region 104 into the cavity wafer 102. The air cavity region 104 is configured with the cavity sides 106 and the bottom surface 108. A cavity layer is then masked and metal is deposited on the bottom surface 108, for example, by electronic vapor deposition. Thereafter, the mask is removed. Subsequently, the membrane wafer 114 is deposited on the cavity wafer 102. A layer of silicon dioxide is deposited over the membrane wafer 114. In an example, an isotropic etch process is performed to form rectangular walls 148 from the silicon dioxide around an area of the membrane wafer 114 while masking the membrane wafer 114. Subsequently, the microbeam 116 is formed in the membrane wafer 114 over the air cavity region 104. In examples, the microbeam 116 may be formed by lithographic etching. The first anchor 122 is formed at the first end 118 of the microbeam 116, and the second anchor 124 is formed at the second end 120 of the microbeam 116. In examples, the first anchor 122 and the second anchor 124 may be formed by etching. Thereafter, a masking pattern may be formed over the membrane wafer 114.

The drive electrode 126 is deposited on the first side of the microbeam 116. The first ground electrode 130 is deposited on the first side of the microbeam 116. The sense electrode 128 is deposited on the second side of the microbeam 116. The second ground electrode 132 is deposited on the second side of the microbeam 116. A first anchor electrode is deposited on the first anchor 122. A second anchor electrode is deposited on the second anchor 124.

A plurality of side electrode pads are deposited in a region of the membrane wafer 114 which is outside of the rectangular walls 148. Deep trench isolation between the plurality of side electrode pads and other components limits the leakage electrical signal in the substrate 110. A wiring pattern of metallic feed lines may then be deposited on the membrane wafer 114 within the area surrounding the rectangular walls 148. The metallic feed lines are configured to connect each of the drive electrode 126, the first ground electrode 130, the sense electrode 128, the second ground electrode 132, the first anchor electrode, and the second anchor electrode to a respective side electrode pad. In examples, the depositions of the drive electrode 126, the first ground electrode 130, the sense electrode 128, the second ground electrode 132, the first anchor electrode, the second anchor electrode, the plurality of side electrode pads, and the wiring pattern may be made by electronic vapor deposition of aluminum.

The masking pattern may then be removed. The rectangular walls 148, the membrane wafer 114, and the cavity wafer 102 are encapsulated with the capping wafer 150, while masking the side electrode pads. The capping wafer 150 is encapsulated with the aluminum layer 151, and the masking is then removed from the side electrode pads. In examples, the capping wafer 150 may be configured to vacuum encapsulate the rectangular walls 148, the membrane wafer 114, and the cavity wafer 102 at a pressure of less than 5 mbar through glass frit wafer bonding.

The AC source 152 is connected to the first side electrode pad of the plurality of side electrode pads which is connected by the first metallic feed line 134 to the drive electrode 126. The DC bias voltage source 154 is connected to the first anchor through the second side electrode pad. The ground 156 is connected to the third side electrode pad and the fourth side electrode pad. The multimeter 160 is connected to the fifth side electrode pad, which is connected to the sense electrode. The multimeter 160 is configured to measure an induced current over a frequency when the AC source 152 and the DC bias voltage source 154 are turned ON. The induced current is generated on the sense electrode 128 which responds to the vibration amplitudes of the microbeam 116. The ground 156 is connected to the sixth side electrode pad, which is connected to the second anchor. The ground 156 is also connected to the seventh side electrode pad.

The computing device 162 is connected to the multimeter 160. The computing device 162 is configured for receiving the induced current, determining a resonant frequency of the induced current based on a magnitude of the induced current, searching the database 166 containing records relating induced current values at each resonant frequency to temperature values, matching the induced current and determined resonant frequency to a temperature value, and displaying the temperature value on the display 164. The temperature values may be linearly related to the induced current within a temperature range of about 30 degree Celsius to 60 degree Celsius.

Examples by which the MEMS temperature sensor 100 may be used are described below. For electrostatically activating the MEMS temperature sensor 100, the AC source 152 may apply a fixed frequency AC current to the drive electrode 126 and the DC bias voltage source 154 may apply a DC bias voltage to the first anchor 122 of the microbeam 116. The DC bias voltage may be applied at about 20 volts and the AC current may be applied at about −32 dBm and at a fixed frequency.

The ground 158 is connected to the second anchor 124 of the microbeam 116, to the first ground electrode 130 adjacent to the drive electrode 126, to the second ground electrode 132 adjacent to the sense electrode 128, to the substrate 110 of the MEMS temperature sensor 100, and to the aluminum layer 151 encapsulating the MEMS temperature sensor 100. The multimeter 160 measures an induced current at the sense electrode 128 over a frequency range.

The computing device 162 connected to the multimeter 160 to receive the induced current. The computing device 162 determines a resonant frequency of the induced current based on a magnitude of the induced current. The computing device 162 search the database 166 containing records relating induced current values at each resonant frequency to temperature values. The temperature values within a temperature range of about 30 degrees Celsius to 60 degrees Celsius are linearly related to the induced current. The computing device 162 may match the induced current and determined resonant frequency to a temperature value. The computing device 162 may display the temperature value on the display 164.

Figure 2:
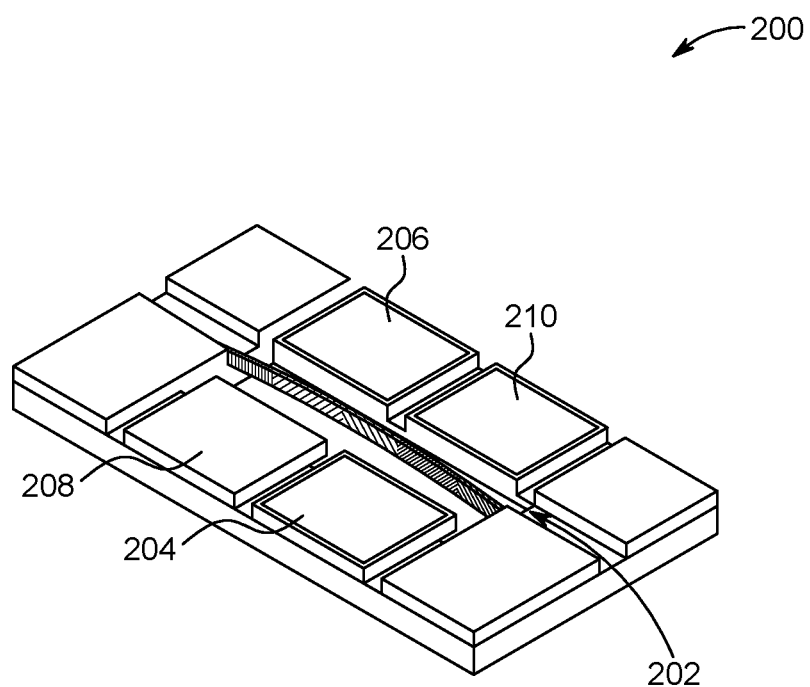
FIG. 2 shows a three-dimensional (3D) schematic of the MEMS temperature sensor, according to certain embodiments.

FIG. 2 shows a three dimensional (3D) schematic of a MEMS temperature sensor 200, according to aspects of the present disclosure. The MEMS temperature sensor 200 is an example of the MEMS temperature sensor 100.

As shown in FIG. 2, the MEMS temperature sensor 200 includes a microbeam 202, a drive electrode 204, a sense electrode 206, a first ground electrode 208, and a second ground electrode 210. The microbeam 202 is an example of the microbeam 116, the drive electrode 204 is an example of the drive electrode 126, the sense electrode 206 is an example of the sense electrode 128, the first ground electrode 208 is an example of the first ground electrode 130, and the second ground electrode 210 is an example of the second ground electrode 132. The microbeam 116 is referred to as clamped-clamped beam. As shown in FIG. 2, the drive electrode 204 and the sense electrode 206 are positioned diagonally. The drive electrode 204 and the sense electrode 206 are located diagonally across from each other to either side of the microbeam 202. The drive electrode 204 is located on a first side of the microbeam 202 near a first end and the sense electrode 206 is located on a second side of the microbeam 202 near a second end. The first ground electrode 208 is located adjacent to the drive electrode 204 on the first side near the second end of the microbeam 202, and the second ground electrode 210 is located adjacent to the sense electrode 206 on the second side near the first end of the microbeam 202.

The drive electrode 204 is configured to activate the MEMS temperature sensor 200 and the sense electrode 206 collects the output of the MEMS temperature sensor 200. In an example, an AC current is applied to the drive electrode 204 and an output is capacitively detected at the sense electrode 206. The first ground electrode 208 and the second ground electrode 210 are grounded to reduce parasitic feedthrough signals.

Figure 3:
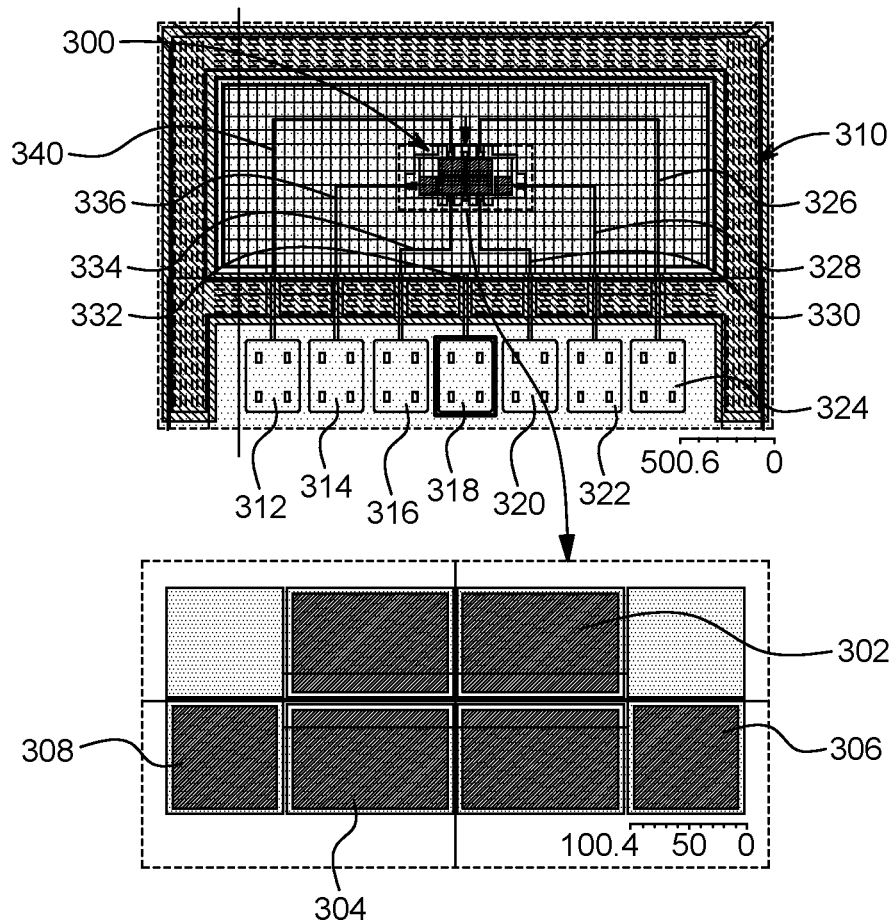
FIG. 3 shows a layout of the MEMS temperature sensor, according to certain embodiments.

FIG. 3 shows a layout of a MEMS temperature sensor 300, according to certain embodiments.

The MEMS temperature sensor 300 is an example of the MEMS temperature sensor 100. The MEMS temperature sensor 300 may be fabricated using XMB10 surface-micromachined capacitive 3D MEMS technology. In examples, the layout of the MEMS temperature sensor 300 is built or created in Cadence Virtuoso software using XMB10 surface-micromachined capacitive 3D MEMS technology (by X-FAB Semiconductor Foundries GmbH, Haarbergstr. 67, 99097 Erfurt, Germany).

As described in FIG. 3, the MEMS temperature sensor 300 includes a drive electrode 302, a sense electrode 304, a first anchor 306, and a second anchor 308. The drive electrode 302 is an example of the drive electrode 126, the sense electrode 304 is an example of the sense electrode 128, the first anchor 306 is an example of the first anchor 122, and the second anchor 308 is an example of the second anchor 124.

The MEMS temperature sensor 300 is placed inside a rectangular frame 310 that defines the area to be sealed. The rectangular frame 310 is an example of rectangular wall 148. In examples, the MEMS temperature sensor 300 may be sealed at low pressure (for example, less than 5 mbar). The drive electrode 302 and the sense electrode 304 may preferably be separated by 2 micron wide air gaps (i.e., the drive electrode 302 and the sense electrode 304 may be spaced about 2 microns from each other). The drive electrode 302, the sense electrode 304, the first anchor 306, and the second anchor 308 can be accessed from outside through the seven exposed side electrode pads including a first side electrode pad 312, a second side electrode pad 314, a third side electrode pad 316, a fourth side electrode pad 318, a fifth side electrode pad 320, a sixth side electrode pad 322, and a seventh side electrode pad 324.

The first side electrode pad 312, the second side electrode pad 314, the third side electrode pad 316, the fifth side electrode pad 320, the sixth side electrode pad 322, and the seventh side electrode pad 324 are connected with different components of the MEMS temperature sensor 300 and the fourth side electrode pad 318 may be used to ground a substrate of the MEMS temperature sensor 300. FIG. 3 shows a first metallic feed line 326 (referred to as the first metallic feed line 134 in FIG. 1), a second metallic feed line 328 (referred to as the second metallic feed line 136 in FIG. 1), a third metallic feed line 330 (referred to as the third metallic feed line 138 in FIG. 1), a fourth metallic feed line 332 (referred to as the fourth metallic feed line 140 in FIG. 1), a fifth metallic feed line 334 (referred to as the fifth metallic feed line 142 in FIG. 1), a sixth metallic feed line 336 (referred to as the sixth metallic feed line 144 in FIG. 1), and a seventh metallic feed line 340 (referred to as the seventh metallic feed line 146 in FIG. 1). The first metallic feed line 326 is connected at a first terminal to the drive electrode and at a second terminal to the first side electrode pad 324. The second metallic feed line 328 is connected at a first terminal to the first anchor 306 and at a second terminal to the second side electrode pad 322. The third metallic feed line 330 is connected at a first terminal to the second ground electrode and at a second terminal to the third side electrode pad 320. The fourth metallic feed line 332 is connected to the fourth side electrode pad 318. The fifth metallic feed line 334 is connected at a first terminal to the sense electrode 304 and at a second terminal to the fifth side electrode pad 316. The sixth metallic feed line 336 is connected at a first terminal to the second anchor 308 and at a second terminal to the sixth side electrode pad 314. The seventh metallic feed line 340 is connected at a first terminal to the second ground electrode and at a second terminal to the seventh side electrode pad 312. FIG. 3 also shows placement of the side electrode pads (312-322) adjacent to one another.

Figure 4:
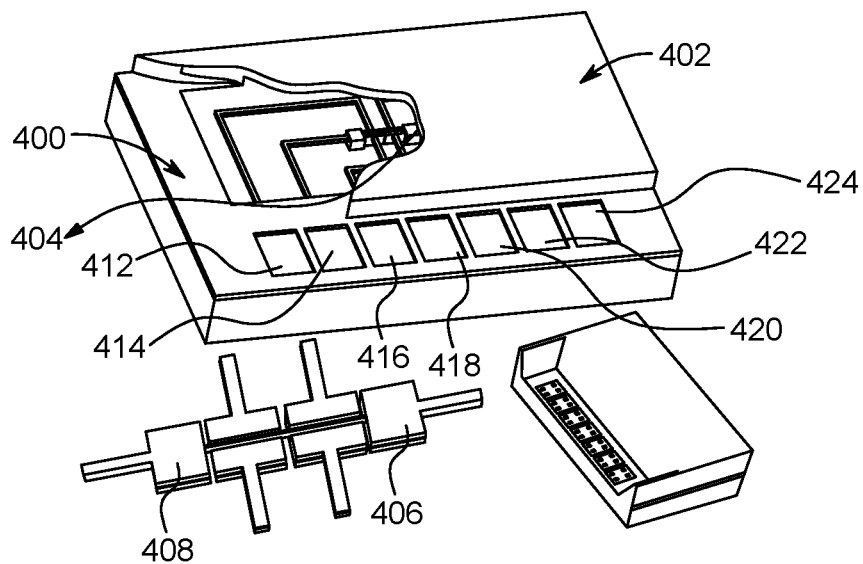
FIG. 4 shows a 3D schematic of a packaged MEMS temperature sensor, according to certain embodiments.

FIG. 4 shows a 3D schematic of a packaged MEMS temperature sensor 400, according to certain embodiments.

The MEMS temperature sensor 400 is sealed in an encapsulated package 402. The MEMS temperature sensor 400 includes a microbeam 404, a first anchor 406, and a second anchor 408. The MEMS temperature sensor 400 is an example of the MEMS temperature sensor 100. The microbeam 404 is an example of the microbeam 116. The first anchor 408 is an example of the first anchor 122. The second anchor 406 is an example of the second anchor 124.

According to aspects of the present disclosure, different components of the MEMS temperature sensor 400 such as the first anchor 408 and the second anchor 406 are accessed from outside the package 402 by connecting metal lines to seven exposed pads including a first side electrode pad 412, a second side electrode pad 414, a third side electrode pad 416, a fourth side electrode pad 418, a fifth side electrode pad 420, a sixth side electrode pad 422, and a seventh side electrode pad 424.

Figure 5:
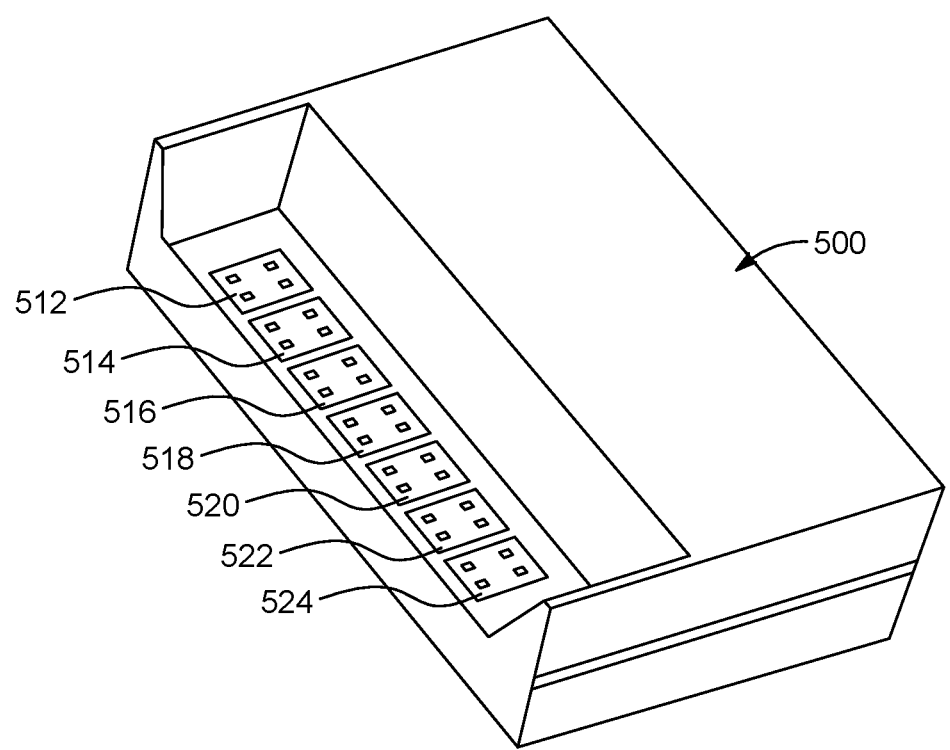
FIG. 5 depicts an image of a fabricated packaged MEMS temperature sensor, according to certain embodiments.

FIG. 5 depicts an illustration of a fabricated packaged MEMS temperature sensor 500, according to aspects of the present disclosure. The MEMS temperature sensor 500 is an example of the MEMS temperature sensor 100. The MEMS temperature sensor 500 is sealed by metal peripherally, while seven side electrode pads including a first side electrode pad 512, a second side electrode pad 514, a third side electrode pad 516, a fourth side electrode pad 518, a fifth side electrode pad 520, a sixth side electrode pad 522, and a seventh side electrode pad 524 are exposed. The sealed MEMS temperature sensor 500 may also be referred to as encapsulated MEMS temperature sensor 500 or encapsulated clamped-clamped MEMS beam resonator 500. The dimensions of the encapsulated MEMS temperature sensor 500 are a length of about 3 mm, a width of about 2 mm and a height of about 1 mm.

Figure 6A:
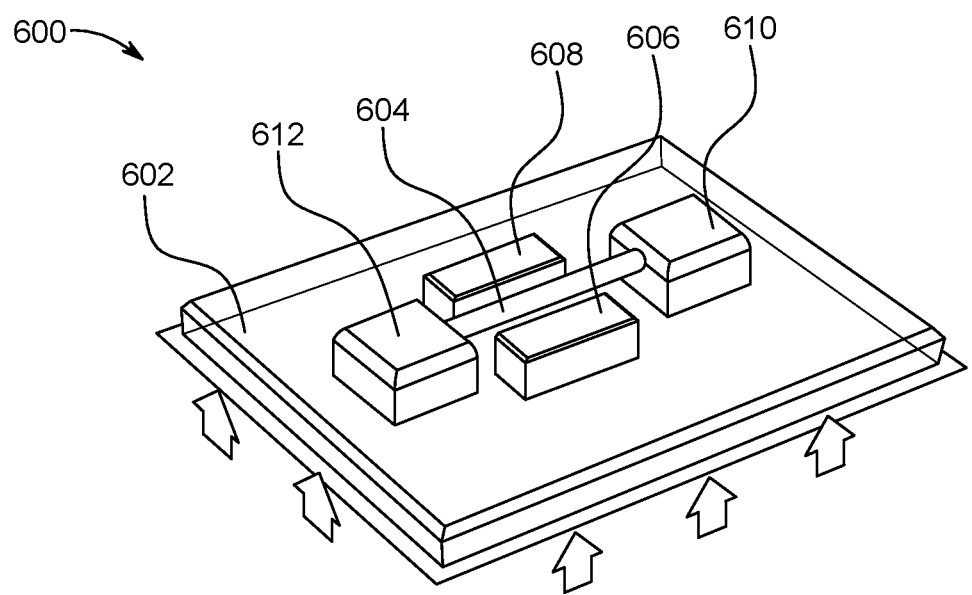
FIG. 6A illustrates a 3D image of the MEMS temperature sensor, according to certain embodiments.

FIG. 6A illustrates a 3D image of a MEMS temperature sensor 600 showing thermal loading on the substrate (as indicated by the upward arrows). The MEMS temperature sensor 600 is a simplified example of the MEMS temperature sensor 100. As shown in FIG. 6A, the MEMS temperature sensor 600 includes a substrate 602, a microbeam 604, a drive electrode 606, a sense electrode 608, a first anchor 610, and a second anchor 612. The substrate 602 may be an example of the substrate 110, the microbeam 604 may be an example of the microbeam 116, the drive electrode 606 may be an example of the drive electrode 126, the sense electrode 608 may be an example of the sense electrode 128, the first anchor 610 may be an example of the first anchor 122, and the second anchor 612 may be an example of the second anchor 124.

Figure 6B:
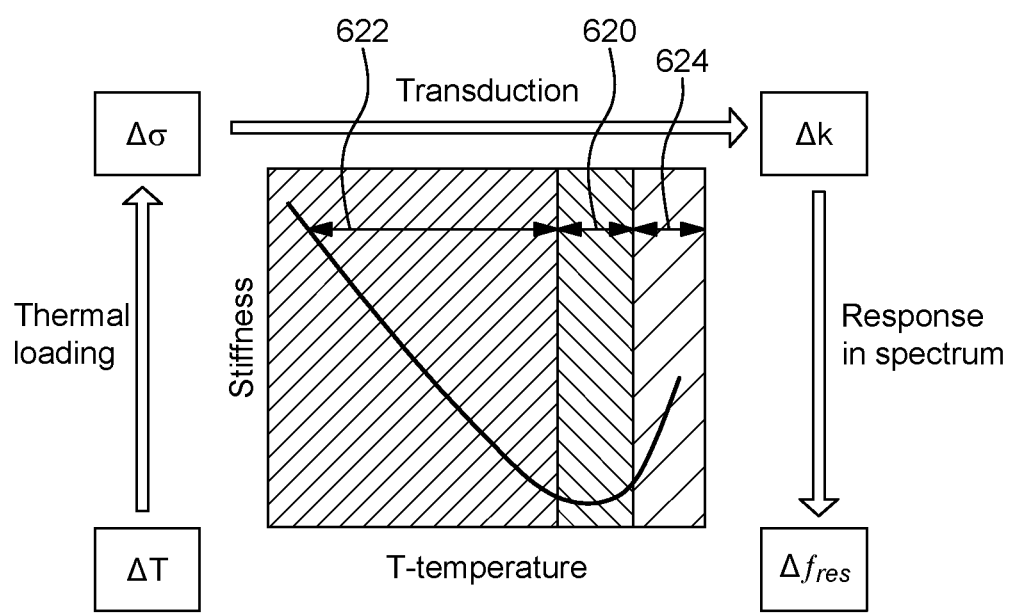
FIG. 6B illustrates a working principle of the MEMS temperature sensor, according to certain embodiments.

FIG. 6B illustrates a working principle of the MEMS temperature sensor 600, according to certain embodiments.

According to aspects of the present disclosure, when the substrate 602 is heated, the thermal loading changes the temperature of the MEMS temperature sensor 600 through heat conduction. This temperature change induces thermal strain or stress on the microbeam 604 (denoted as "Δσ"), which leads to a change in the stiffness of the microbeam 604 (denoted as "Δk"), thereby shifting the resonant frequency (denoted as "$\Delta f_{res}$"). This shift in the resonant frequency can be detected by a frequency readout, and then converted into a temperature change. For a given temperature change (denoted as "ΔT"), the change in the resonant frequency reflects frequency responsivity (denoted as "$R_f$") of the MEMS temperature sensor 600 which is defined as the ratio between the change in the resonant frequency (denoted as "Δf") and a given change in the temperature (denoted as "ΔT"). In examples, larger $R_f$ values correspond to a larger change of the resonant frequency. The frequency responsivity of the MEMS temperature sensor 600 may be mathematically expressed using Equation (1) provided below.

$$R_f = \frac{\Delta f}{\Delta T} \tag{1}$$

For the MEMS temperature sensor 600, the temperature coefficient of frequency (TCF) is temperature-dependent and highly non-linear around a thermal buckling temperature region (represented by reference number "620" in FIG. 6B). Thus, the MEMS temperature sensor 600 should be preheated in pre-buckling (softness) temperature region (represented by reference number "622" in FIG. 6B) or post-buckling (hardness) temperature region (represented by reference number "624" in FIG. 6B) to achieve the TCF of highest linearity (i.e., to increase the linearity of the frequency-temperature dependency).

Figure 6C:
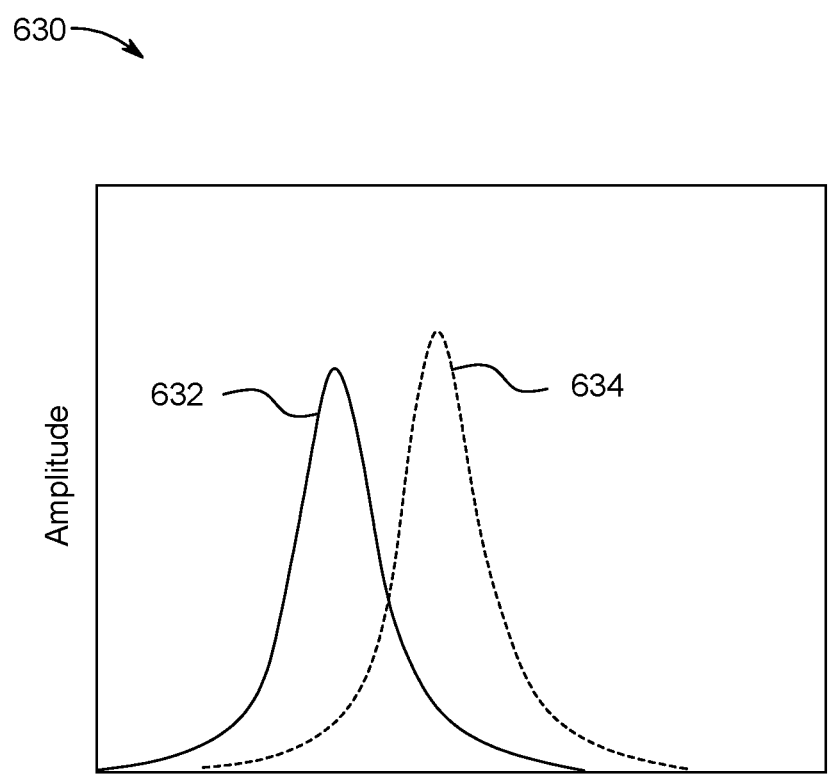
FIG. 6C shows a plot illustrating frequency response of the MEMS temperature sensor when thermal heating is switched ON and OFF, according to certain embodiments.

FIG. 6C shows a plot 630 illustrating the amplitude of the frequency response of the MEMS temperature sensor 600 when the thermal heating is switched ON and OFF.

The changes in the temperature of the substrate 602 can be detected from changes in the resonant frequency. Plot line 632 depicts a frequency response of the MEMS temperature sensor 600 when thermal heating is switched ON. Plot line 634 depicts frequency response of the MEMS temperature sensor 600 when thermal heating is switched OFF.

Figure 6D:
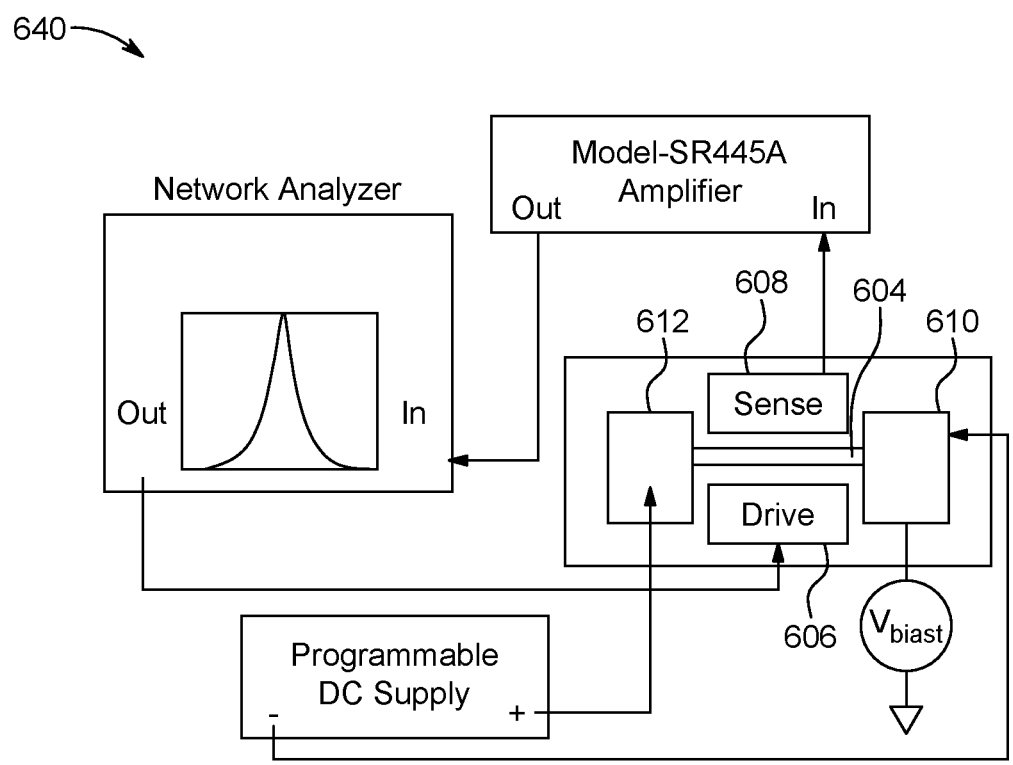
FIG. 6D shows a schematic diagram of the MEMS temperature sensor, according to certain embodiments.

FIG. 6D shows a schematic diagram 640 of the MEMS temperature sensor 600, according to certain embodiments.

According to an implementation, a DC bias voltage is applied to the first anchor 610 of the microbeam 604. The DC bias voltage heats the microbeam to an operating temperature. An AC signal is applied to the drive electrode 606 for electrostatic actuation on the MEMS temperature sensor 600. The in-plane vibration of the microbeam 604 generates an AC motional current that can be recorded at the sense electrode 608.

The packaged MEMS temperature sensor 600 may be placed on a temperature-controlled chuck and the temperature may be increased from 25 degrees Celsius to 125 degrees Celsius with steps of 10 degrees Celsius. The first anchor 610 of the microbeam 604 is biased with a DC voltage and an AC signal is applied on the drive electrode 606 to electrostatically actuate the MEMS temperature sensor 600. The in-plane vibration of the microbeam 604 generates an AC motional current that can be recorded at the sense electrode 608. The change in resonant frequency and quality factor (also referred to as Q factor) may be monitored by recording the frequency response curves under different temperatures using a network analyzer. Temperature coefficient of frequency (TCF) and frequency stability noise (denoted as "$\sigma_A$") of the MEMS temperature sensor 600 are determined while varying the operating temperatures. A thermal or an electrothermal voltage (i.e., an additional voltage, denoted as "$V_H$") may be applied between the first anchor 610 and the second anchor 612 of the microbeam 604 to induce a DC current that heats the microbeam 604 through Joule heating. This leads to an increase in the localized thermal stress axial load, resulting in the improvement of thermal sensitivity of the MEMS temperature sensor 600.

Experiments were performed to verify that the temperature variations could be read from the voltage output of the MEMS temperature sensor 600. The changes in minimum detectable temperature (MDT) and hysteresis response were measured to evaluate the performance of the MEMS temperature sensor 600.

Figure 7:
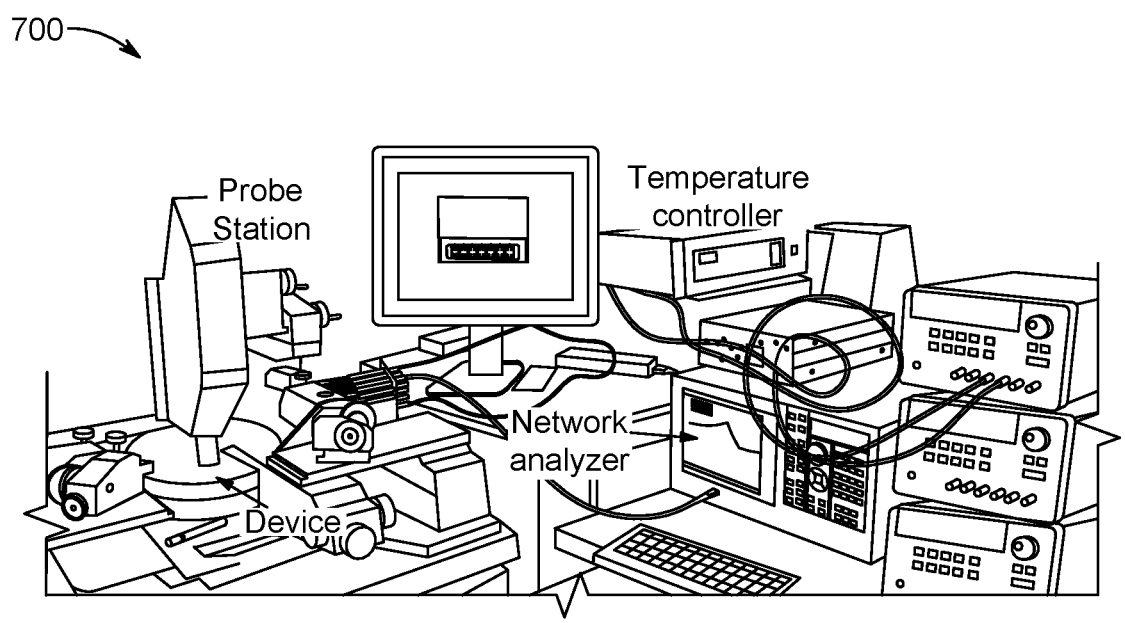
FIG. 7 describes an experimental setup for the MEMS temperature sensor, according to certain embodiments.

FIG. 7 describes an experimental setup 700 for the MEMS temperature sensor 100, according to certain embodiments.

The characterization investigation was conducted on a packaged MEMS temperature sensor 700 with varying temperatures. The MEMS temperature sensor 700 was sealed within low pressure (for example, less than 5 mbar) and seven pads were accessible. The packaged MEMS temperature sensor 700 allowed the characterization to be performed at ambient pressure without vacuum chamber since it was sealed under low pressure. The six exposed pads were connected with different components of the MEMS temperature sensor 700 and a middle exposed pad from amongst the seven pads was used to ground the substrate of the MEMS temperature sensor 700.

The thermomechanical behavior of the MEMS temperature sensor 700 was tested on a probe station fitted with a temperature controller (for example, ERS AirCool GmbH-SP72 controller, manufactured by ERS electronic GmbH Stettiner Str. 3, 82110 Germering, Germany). The commercial control system (low-noise DC/PID with dynamic temperature control) was used to control and adjust the operating temperature of the MEMS temperature sensor 700, which was monitored by a Pt-100, 4-line wired temperature sensor. A DC bias voltage was applied to the microbeam 116 (see FIG. 1) by a DC power supply (for example, Keysight E3634A supply, manufactured by Keysight 1400 Fountaingrove Parkway, Santa Rosa, CA, 95403-1738, USA). The microbeam 116 was excited electrostatically by applying a sinusoidal signal across the drive electrode 126. In an example, the sinusoidal signal may be an AC signal or AC current. The motion of the microbeam 116 generated the capacitive current on the sense electrode 128, and the motion-induced output current was measured and analyzed using an ENA series network analyzer (for example, the E5071C, manufactured by Keysight 1400 Fountaingrove Parkway, Santa Rosa, CA, 95403-1738, USA) after amplification by a low-noise preamplifier (for example, the SR560, manufactured by Stanford Research Systems, inc, 1290-D Reamwood Ave. Sunnyvale, CA 94089, USA) with a gain of 5. A sensitivity improvement was accomplished by applying an additional electrothermal voltage on the first anchor 122 and the second anchor 124 of the microbeam 116. The electrothermal voltage was provided using a programmable DC power supply. In example, the additional voltage for generating Joule heating current on the microbeam 116 was supplied by programmable DC supply (for example, the E36324A, manufactured by Keysight 1400 Fountaingrove Parkway, Santa Rosa, CA, 95403-1738, USA). As the DC current increased, the axial compressive stress of the microbeam 116 increased. Minimizing these variations may be performed through stochastic control, or through different stress engineering techniques such as surface micromachining with properly designed boron diffusion and high temperature rapid thermal annealing processes. In addition, calibration of the devices and using different operating conditions (e.g., microbeam bias) may help in minimizing the impact of variations on the MEMS temperature sensor 100. In examples, the resonant frequency was decreased with the increasing compressive axial stress. The MEMS temperature sensor 100 exhibited enhanced sensitivity and lower area-cost.

Figure 8:
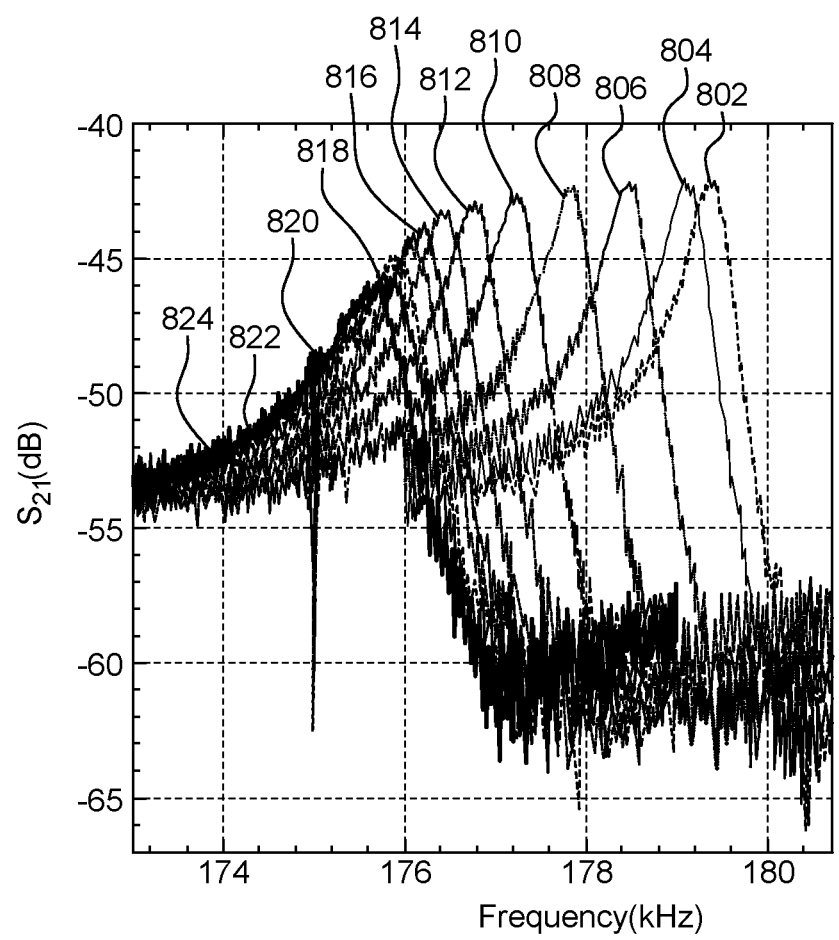
FIG. 8 shows a plot of a measured frequency response of the MEMS temperature sensor and measured resonant frequency at different temperatures, according to certain embodiments.

FIG. 8 is a plot 800 illustrating the measured frequency response of the MEMS temperature sensor 100 and the measured resonant frequency under the temperature ranges of 20 degrees Celsius to 125 degrees Celsius, according to certain embodiments. Plot line 802 depicts the frequency response of the MEMS temperature sensor 100 at 20 degrees Celsius. Plot line 804 depicts the frequency response of the MEMS temperature sensor 100 at 25 degrees Celsius. Plot line 806 depicts the frequency response of the MEMS temperature sensor 100 at 35 degrees Celsius. Plot line 808 depicts frequency response of the MEMS temperature sensor 100 at 45 degrees Celsius. Plot line 810 depicts the frequency response of the MEMS temperature sensor 100 at 55 degrees Celsius. Plot line 812 depicts the frequency response of the MEMS temperature sensor 100 at 65 degrees Celsius. Plot line 814 depicts the frequency response of the MEMS temperature sensor 100 at 75 degrees Celsius. Plot line 816 depicts the frequency response of the MEMS temperature sensor 100 at 85 degrees Celsius. Plot line 818 depicts the frequency response of the MEMS temperature sensor 100 at 95 degrees Celsius. Plot line 820 depicts the frequency response of the MEMS temperature sensor 100 at 105 degrees Celsius. Plot line 822 depicts the frequency response of the MEMS temperature sensor 100 at 115 degrees Celsius. Plot line 824 depicts the frequency response of the MEMS temperature sensor 100 at 125 degrees Celsius.

To verify the effects of temperature on the encapsulated MEMS temperature sensor 100, the first mode frequency response of the MEMS temperature sensor 100 in the temperature range from 20 degrees Celsius to 125 degrees Celsius was obtained. At the temperature range of 85 degrees Celsius to 125 degrees Celsius, the spectrum of the resonance showed the amplitude drop with increasing temperature. The resonant frequency shift at the temperature range of 20 degrees Celsius to 60 degrees Celsius had a noticeable linearity with the varying temperature. Considering the sensitivity aspect of the MEMS temperature sensor 100, the MEMS temperature sensor 100 operated at the temperature range of 20 degrees Celsius to 60 degrees Celsius gained a superior sensitivity than the range of 85 degrees Celsius to 125 degrees Celsius which was apparent from the slopes of the curve of frequency and temperature.

Figure 9:
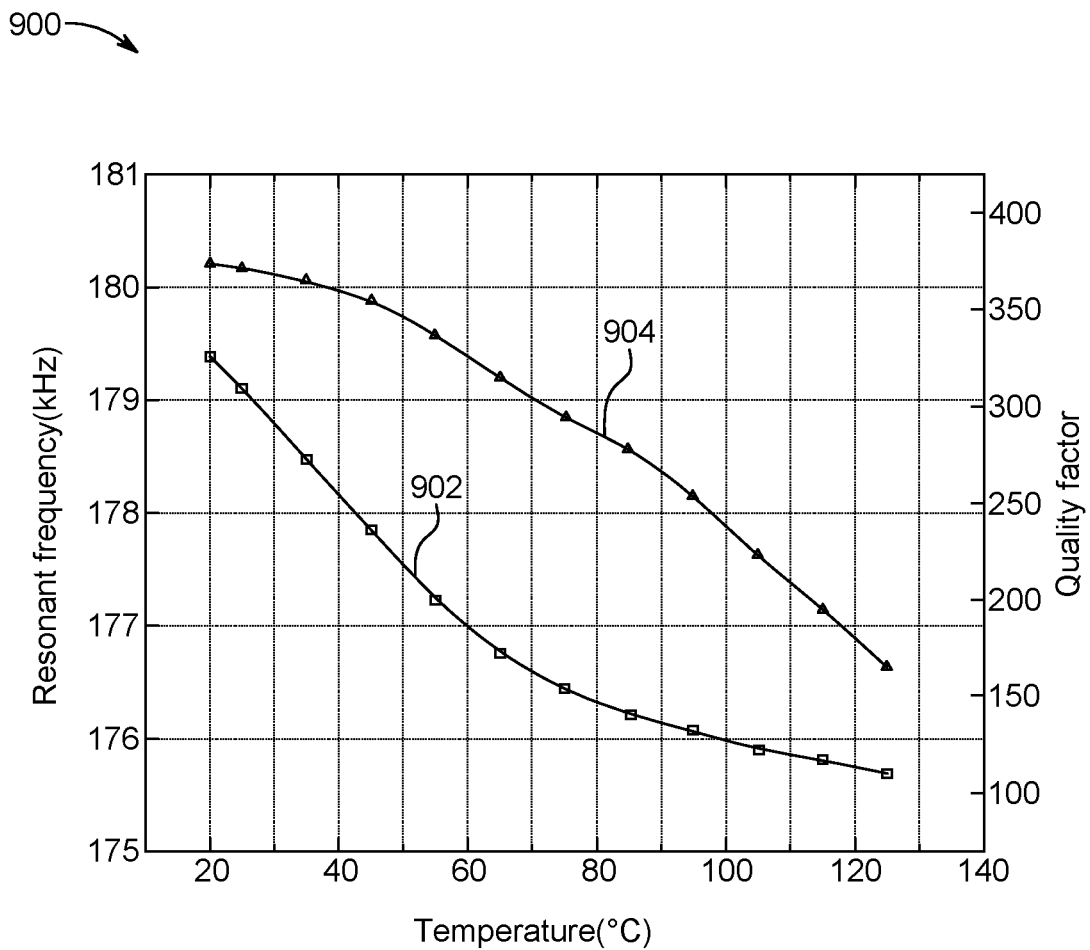
FIG. 9 shows a plot illustrating resonant frequencies and quality factors of the MEMS temperature sensor at different temperatures, according to certain embodiments.

FIG. 9 shows a plot 900 illustrating resonant frequencies and quality factors of the MEMS temperature sensor 100 at different temperatures, according to certain embodiments.

In particular, FIG. 9 shows the plot 900 illustrating resonant frequencies and quality factors of a fundamental mode of the MEMS temperature sensor 100 versus temperature measured at a DC bias voltage of about 20 volts and an AC current with a power of about −32 dBm. Plot line 902 illustrates the resonant frequency and plot line 904 illustrates the quality factor.

At each temperature, the resonant frequency and the quality factor were extracted from the measured transmission parameter ($S_{21}$). Upon thermal loading, the packaged MEMS temperature sensor 100 swelled and resulted in a compressive stress in the substrate 110 and the microbeam 116. The mismatch between CTEs of different materials in the stacked wafers (i.e., the cavity wafer 102, the membrane wafer 114, and the capping wafer 150) induced an additional temperature-dependent stress in the microbeam 116. The thermally induced strain within the microbeam 116 was proportional to the temperature change (denoted as "ΔT") and the mismatch in the thermal expansion coefficients CTEs (denoted as "$\alpha_{mis}$") of the materials comprising the package ($\varepsilon \approx \alpha_{mis} \times \Delta T$). The temperature-dependent stress (denoted as "σ(T)", where σ(T)≈E×ε") affected the stiffness of the microbeam 116, which shifted the resonant frequency (i.e., $f_{res} \approx \sqrt{\sigma_r - \sigma(T)}$, where $\sigma_r$ is the critical buckling stress of the MEMS temperature sensor 100). As shown in FIG. 9, the MEMS temperature sensor 100 entered a temperature-insensitive region at around 85 degree Celsius. Meanwhile, the resonant frequency spectrum (i.e., plot line 902) displayed an amplitude drop because of the material softening and induced stress at the temperature range of 85 degree Celsius to 125 degree Celsius as shown in FIG. 9.

Moreover, regarding the responsivity aspect of the MEMS temperature sensor 100, the MEMS temperature sensor 100 performed at a superior responsivity when the temperature was in the range of 20 degree Celsius to 60 degree Celsius compared to 85 degree Celsius to 125 degree Celsius. The measured quality factor (denoted as "Q") was highest near room temperature (i.e., 20 degree Celsius as Q 370 without material softening effects. The measured quality factor dropped to Q 170 at 125 degree Celsius because of the intrinsic energy loss in the material.

Figure 10:
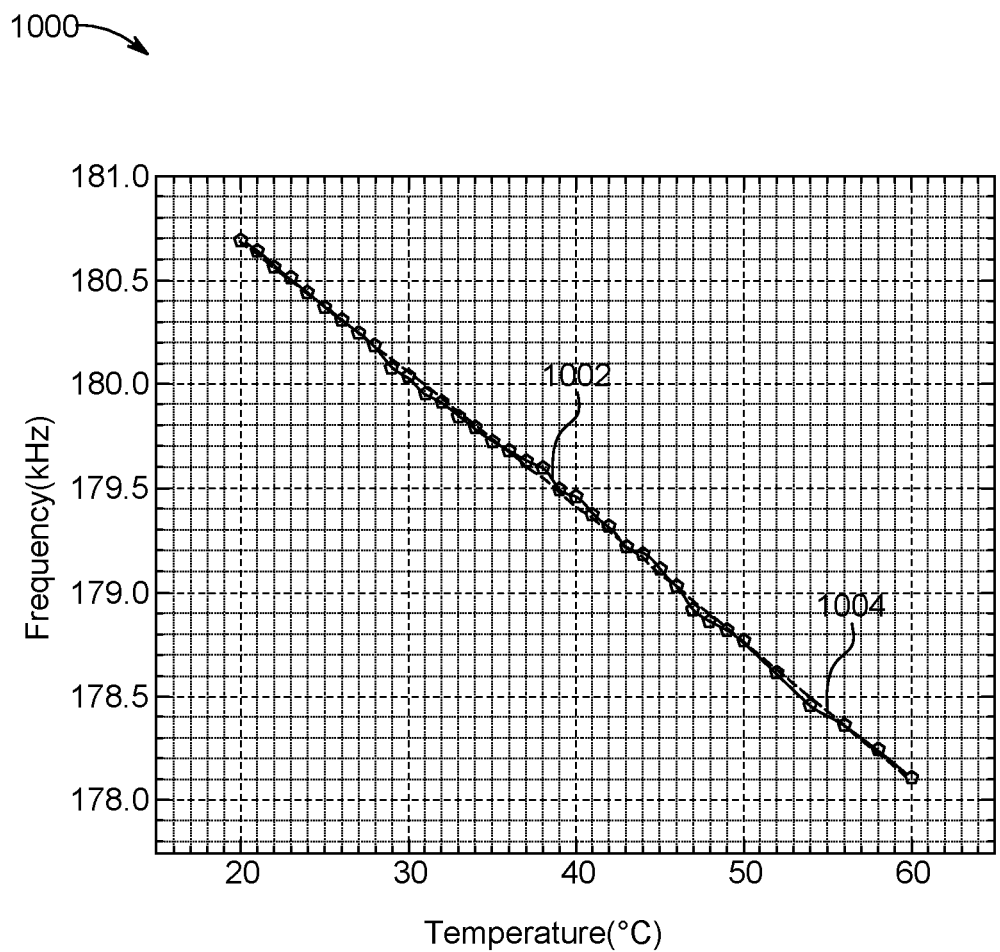
FIG. 10 shows a plot illustrating a linear relationship between the resonant frequency and temperature when an AC drive signal with a power of −13 dBm is applied to a drive electrode of the MEMS temperature sensor, according to certain embodiments.

FIG. 10 shows a plot 1000 illustrating a linear relationship between the resonant frequency and temperature when an AC drive signal (i.e., AC current) with a power of −13 dBm was applied to the drive electrode 126.

In particular, the plot 1000 illustrates the resonant frequency versus temperature with linearity analysis of the MEMS temperature sensor 100 measured at a DC bias voltage of about 20 volts and an AC current with a power of about −13 dBm for enhanced linearity. Plot line 1002 illustrates the resonant frequency and plot line 1004 illustrates the fitted curve.

A linear fitting analysis showed that the resonant frequency has a noticeable linear temperature dependency with an R-square value of 0.99892. In addition, the MEMS temperature sensor 100 further exibits enhanced linearity over a wider temperature range by offsetting two similar second-order TCFs. Thus, the compensated second-order TCF is orders of magnitude smaller than the first-order TCF resulting in high linearity in a wider temperature range. The encapsulated MEMS temperature sensor 100 has a highly linear frequency responsivity of 64.7 Hz/° C. over the temperature range of 20 degrees Celsius to 60 degrees Celsius.

Figure 11A:
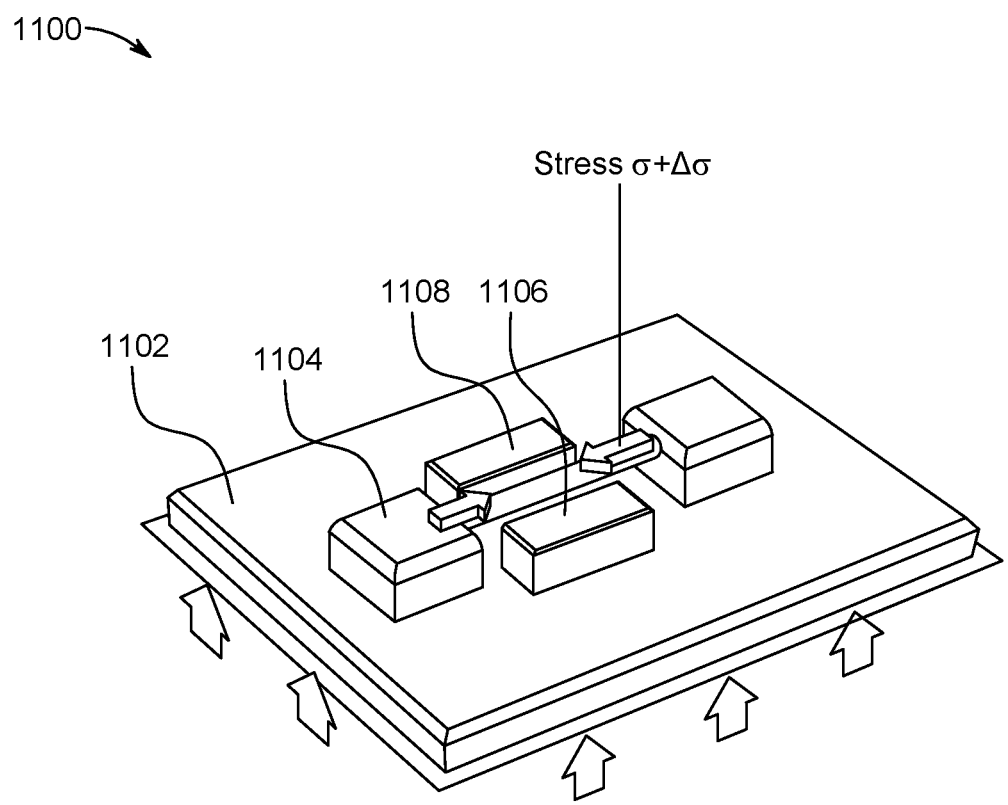
FIG. 11A illustrates the MEMS temperature sensor with a fixed driven frequency, according to certain embodiments.
Figure 11B:
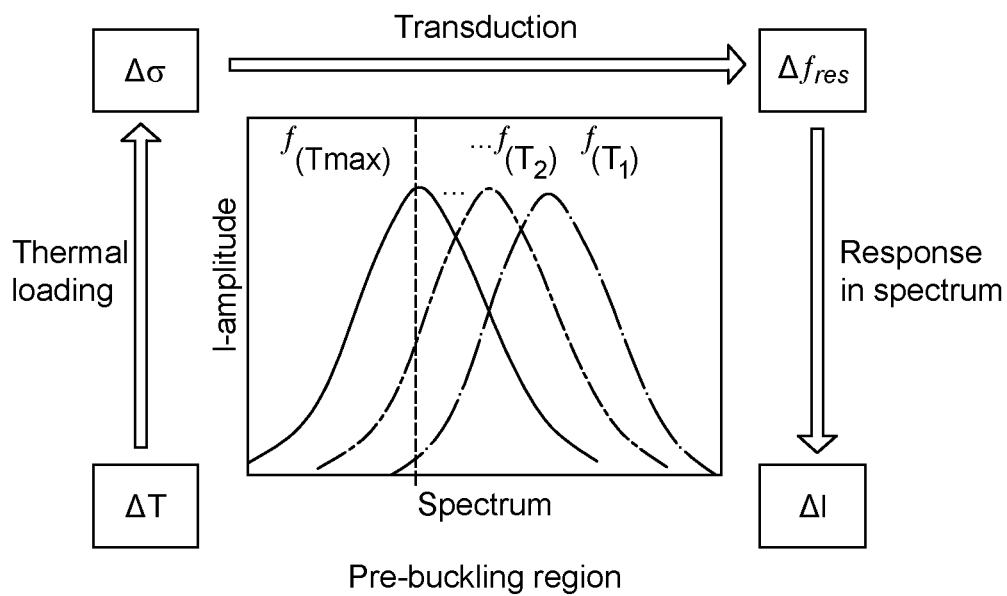
FIG. 11B illustrates an example of frequency response of the MEMS temperature sensor heated from a temperature $T_1$ to a temperature $T_{max}$, according to certain embodiments.
Figure 11C:
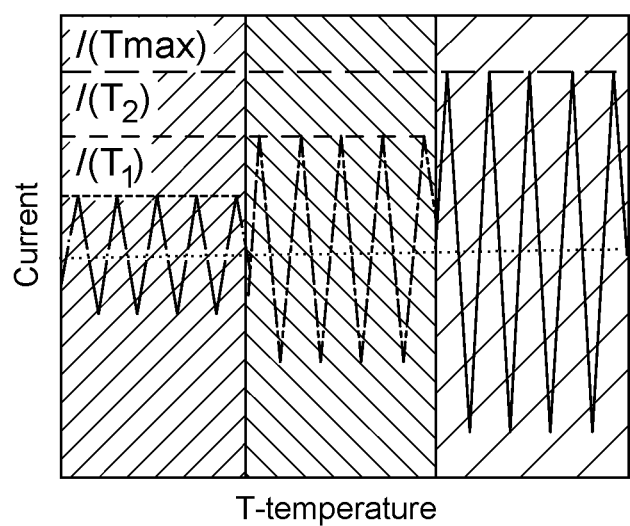
FIG. 11C illustrates an example of current output at a fixed drive frequency when the temperature is varied from $T_1$ to $T_{max}$, according to certain embodiments.

FIG. 11A, FIG. 11B, and FIG. 11C illustrate an amplitude-sensing principle of a MEMS temperature sensor 1100, according to certain embodiments. In particular, FIG. 11A illustrates the MEMS temperature sensor 1100 with a fixed drive frequency (denoted as "$f_{(T+\Delta T)}$"). The MEMS temperature sensor 1100 includes a substrate 1102, a microbeam 1104, a drive electrode 1106, and a sense electrode 1108. The MEMS temperature sensor 1100 is an example of the MEMS temperature sensor 100, the substrate 1102 is an example of the substrate 110, the microbeam 1104 is an example of the microbeam 116, the drive electrode 1106 is an example of the drive electrode 126, and the sense electrode 1108 is an example of the sense electrode 128. FIG. 11B illustrates an example 1120 of frequency response of the MEMS temperature sensor 1100 heated from a temperature $T_1$ to a temperature $T_{max}$. FIG. 11C illustrates an example 1130 of current output at a fixed drive frequency (denoted as "$f_{(Tmax)}$") when the temperature is varied from $T_1$ to $T_{max}$.

A simplified readout procedure was based on amplitude monitoring of the capacitively induced current on the sense electrode 1108. The MEMS temperature sensor 1100 was driven at a fixed frequency and the induced variations in the current amplitude was detected.

For the MEMS temperature sensor 1100 operating in the prebuckling (softness) region, increasing thermal loading from the bottom of the substrate 1102 induced the compressive strain on the microbeam 1004, thereby reducing the stiffness of the microbeam 1104 and in turn lowering the mechanical resonant frequency of the MEMS temperature sensor 1100. The operating parameters of the MEMS temperature sensor 1100 may be adjusted such that a unique single solution exists at $f_{(Tmax)}$ for each temperature within the sensing range, as shown in FIG. 11B.

As shown in FIG. 11B, for the MEMS temperature sensor 1100 driven at a fixed operational frequency $f_{(T+\Delta T)}$, the frequency shift due to a change of the temperature is equivalent to the induced current amplitude change and caused the insertion loss variations. The thermal loading from the substrate 1102 changed the temperature from $T_1$ to $T_2$, which changed the thermal strain and decreased the resonant frequency from $f_{(T1)}$ to $f_{(T2)}$. Subsequently, the MEMS temperature sensor 1100 driven at $f_{(Tmax)}$ converted the change in temperature into an increase in the output amplitude from $I_{(T1)}$ to $I_{(T2)}$.

FIG. 11C demonstrates the output in the time domain when the frequency is fixed at $f_{(Tmax)}$, and the change in the temperature of the substrate 1102 can be detected from the change in the current amplitude.

All output signals have the same frequency with different amplitudes depending on the temperature. An increase in the resonant frequency (for example, from $f_{(T2)}$ to $f_{(T1)}$) leads to a decrease in the induced current amplitude (for example, from $I_{(T2)}$ to $I_{(T1)}$), while the drive frequency is maintained at $f_{(Tmax)}$. The current drop can be estimated as:

$$\log I_{(T1)} \approx \log I_{(T2)} - \frac{3(f_{(T1)} - f_{(T2)})}{20(f_{(Tmax)}/2Q)} \qquad (2)$$

Accordingly, the temperature is measured directly by tracking the output amplitude without requiring additional readout circuits. Benefiting from the physical parasitical signal cancellation, the motional induced current can be directly read out without parasitic signal cancellation by using a differential amplifier. The temperature range was determined according to the operating frequency (or drive frequency) and full width at half maximum power (or peak width). To obtain the current amplitude increase upon temperature rising, the operating frequency is the resonant frequency when the temperature is maximum, which corresponds to $T_{max}$=44° C.

Figure 12A:
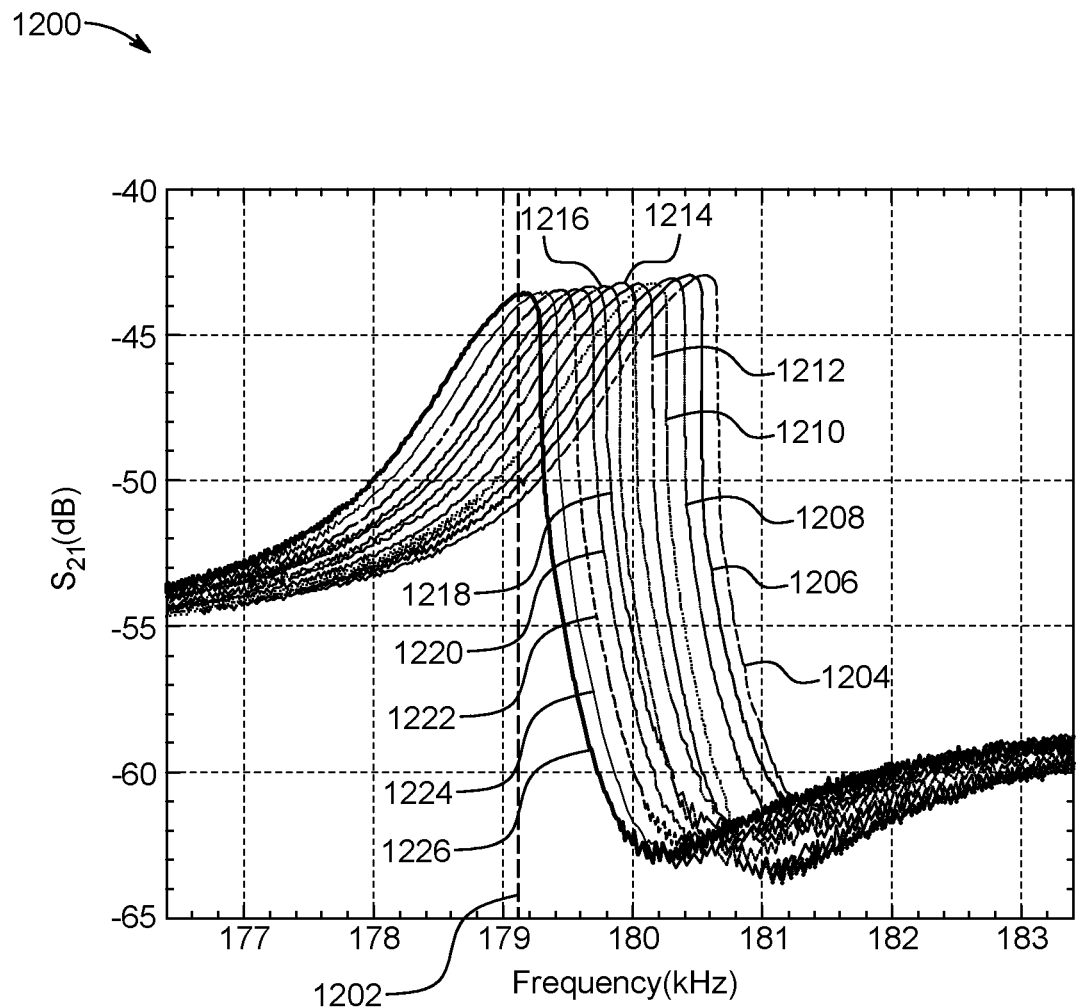
FIG. 12A shows a plot illustrating frequency responses of the MEMS temperature sensor at a DC bias voltage of about 20 volts and an AC current with a power of about −13 dBm for different temperatures, according to certain embodiments.

FIG. 12A shows a plot 1200 illustrating the frequency response of the MEMS temperature sensor 100 at a DC bias voltage of about 20 volts and an AC current with a power of about −13 dBm for a temperature range of 22 degrees Celsius to 42 degrees Celsius. Plot line 1204 depicts frequency response of the MEMS temperature sensor 100 at 22 degrees Celsius. Plot line 1206 depicts frequency response of the MEMS temperature sensor 100 at 24 degrees Celsius. Plot line 1208 depicts frequency response of the MEMS temperature sensor 100 at 26 degrees Celsius. Plot line 1210 depicts frequency response of the MEMS temperature sensor 100 at 28 degrees Celsius. Plot line 1212 depicts frequency response of the MEMS temperature sensor 100 at 30 degrees Celsius. Plot line 1214 depicts frequency response of the MEMS temperature sensor 100 at 32 degrees Celsius. Plot line 1216 depicts frequency response of the MEMS temperature sensor 100 at 34 degrees Celsius. Plot line 1218 depicts frequency response of the MEMS temperature sensor 100 at 36 degrees Celsius. Plot line 1220 depicts frequency response of the MEMS temperature sensor 100 at 38 degrees Celsius. Plot line 1222 depicts frequency response of the MEMS temperature sensor 100 at 40 degrees Celsius. Plot line 1224 depicts frequency response of the MEMS temperature sensor 100 at 42 degrees Celsius. Plot line 1226 depicts frequency response of the MEMS temperature sensor 100 at 44 degrees Celsius.

As shown in FIG. 12A, the operating frequency (represented by reference number "1202") is the resonant frequency at the maximum temperature (denoted as "$T_{max}$", where $T_{max}=44°$ C.), which was found to be 179.117 kHz. The operating frequency may be denoted as $f_{(Tmax)}$. At the operating frequency, the output amplitude and the insertion loss $S_{21}$ decreased with a decrease in temperature because the resonant peak shifted towards the right side at lower temperatures. The minimum temperature (denoted as "$T_{min}$") may be determined by the noise floor such that the amplitude at the operating frequency resulting from the minimum temperature should be at least 3 dB higher than the noise floor (or background signal). The value of noise floor may be −54 dB. In the example described in FIG. 12A, the insertion loss at the operating frequency is −51 dB, which is 3 dB higher than the noise floor. FIG. 12A shows that at an operating frequency, the insertion loss keeps dropping with decreasing temperatures until to minimum temperature. In the experiments, $T_{min}=22°$ C. The induced current amplitude may be converted into a voltage amplitude via the internal input resistance of the network analyzer.

Figure 12B:
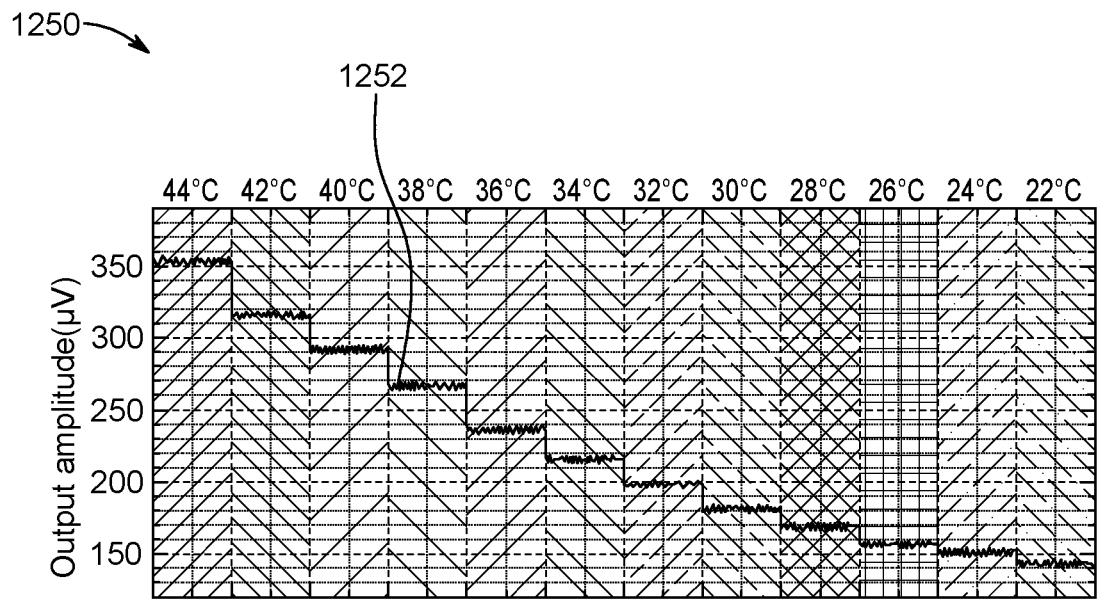
FIG. 12B(a) and FIG. 12B(b) illustrate an example of sensed signal amplitude of the MEMS temperature sensor operating at a fixed frequency and varying temperatures, according to certain embodiments.
Figure 12B:
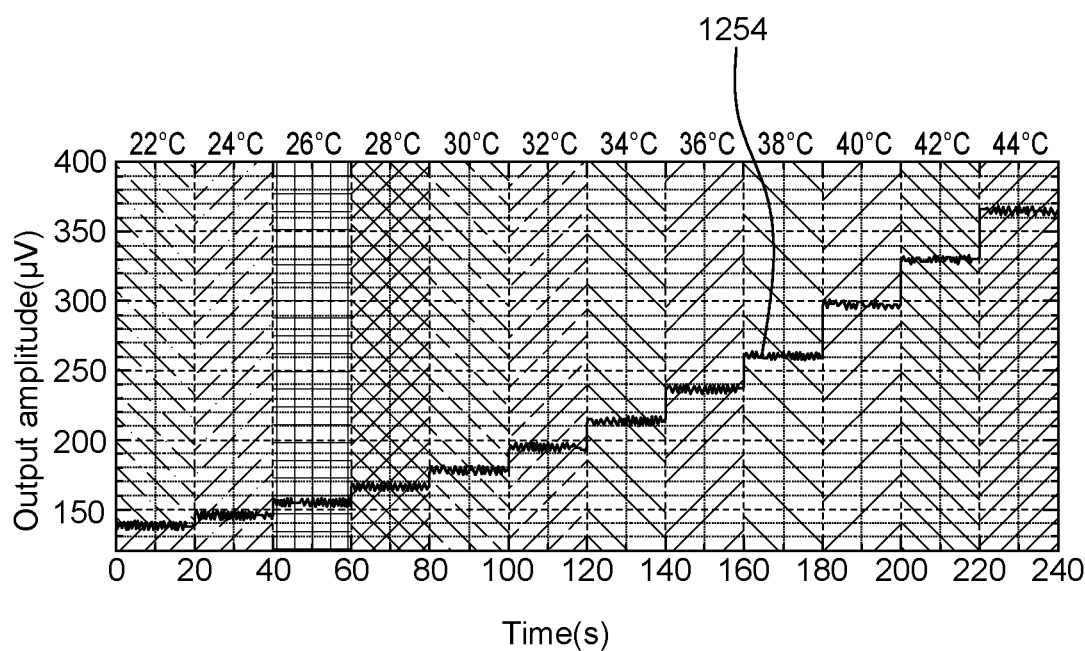

FIG. 12B(a) and FIG. 12B(b) illustrate an example 1250 of sensed signal amplitude of the MEMS temperature sensor 100 operating at a fixed frequency and the temperatures varying from 22 degree Celsius to 44 degree Celsius with steps of 2 degree Celsius. FIG. 12B(a) shows the voltage amplitude output variations during temperature ramp down and FIG. 12B(b) shows the voltage amplitude output variations during temperature ramp up. Plot line 1252 represents signal amplitude of the MEMS temperature sensor 100 operating at a fixed frequency and when the temperature ramps down. Plot line 1254 represents signal amplitude of the MEMS temperature sensor 100 operating at a fixed frequency and when the temperature ramps up.

One of the figures of merit for the MEMS temperature sensor 100 is voltage responsivity, which is defined as the voltage amplitude variation to the temperature changes. The voltage responsivity is mathematically expressed using Equation (3) provided below.

$$R_V = \frac{\Delta V}{\Delta T} \tag{3}$$

In an aspect, at $f_{(Tmax)}=44°$ C., the voltage amplitude dropped from 354 µV to 143 µV with a decrease in temperature from 44 degree Celsius to 22 degree Celsius, corresponding to an average voltage responsivity of 9.6 µV/° C. As shown in FIG. 12B(a) and FIG. 12B(b), the signal-to-noise ratio (SNR) of the output may be estimated as 20 log $$\frac{S}{N},$$

where N is the maximum noise level of the output, which is around 35.4 µV, and S is the maximum output voltage level, which is around 365 µV, thus leading to the SNR gain of 20.3 dBs obtained at the operating frequency. As the temperature ramped up and down, the voltage amplitude exhibited good stability and repeatability in reflecting temperature change. In comparison to frequency tracking, the voltage amplitude tracking approach is simpler and more practical. The responsivity of the voltage amplitude has a limited temperature sensing range. The temperature sensing range can be expanded by either decreasing the TCF or extending the bandwidth. The frequency bandwidth of the MEMS temperature sensor 100 is directly proportional to the quality factor, which can be modified by tuning the air pressure in the package during manufacturing. A lower quality factor value corresponds to a wider bandwidth, leading to a broader temperature sensing range. In addition, the voltage output resolution can be enhanced by increasing the SNR of the MEMS temperature sensor 100, which is limited mainly by the thermomechanical displacement noise of the MEMS temperature sensor 100. Considering that increasing the quality factor also improves the SNR and voltage responsivity, the quality factor of the MEMS temperature sensor 100 must be carefully selected based on these trade-offs to satisfy the requirements of the application. Accordingly, the quality factor is essential to be considered according to the voltage responsivity of the MEMS temperature sensor 100 and range for practical application requirements. The voltage output tracking method exhibited good stability and repeatability with the temperature ramp-up and down processes. The voltage amplitude tracking method is simpler and more practical compared with frequency tracking method.

The resonant frequency may be determined based on the thermal stress. In an example, the resonant frequency may be determined as:

$$f_{res} \sim \sqrt{1 - \frac{\sigma(T)}{\sigma_r}} \tag{4}$$

where $\sigma(T)$ represents the thermal stress applied axially to the microbeam 116 and $\sigma_r$ represents Euler's critical load at which the microbeam 116 buckles.

Accordingly, the magnitude of the TCF can be derived as proportional to $(4\sigma_r(\sigma_r-\sigma(T)))^{-1/2}$ without considering the deformation effects of the MEMS temperature sensor 100. Thus, the TCF can be optimized by increasing $\sigma(T)$ to be close to $\sigma_r$, which results in a theoretical maximum sensitivity that can be simplified as $$\frac{1}{\sqrt{4\sigma_r(\partial\sigma/\partial T)}}\bigg|_{\sigma=\sigma_r}.$$

To increase $\sigma(T)$, a DC current is passed through the microbeam 116, which induces a localized thermal stress on the microbeam via Joule heating. The temperature profile of the Joule-heated microbeam 116 is distributed non-uniformly, where the maximum temperature is at the center position (denoted as "$T_{cen}$") and the minimum temperature is at the end position (denoted as "$T_{end}$"). The temperature difference of the microbeam 116 can be derived by considering thermal conduction and heat generation effects. In an example, the temperature difference between the ends and center of the microbeam 116 can be derived using Equation (5) provided below.

$$\Delta T_{beam} = T_{cen} - T_{end} = \frac{I^2 \rho L^3}{2VAk} \quad (5)$$

where I represents the current flow, $\rho$ represents the density, k represents the thermal conduction constant, and L, V, and A represents the length, volume, and cross-sectional area, respectively, of the microbeam 116.

Consequently, the temperature difference between the ends and center of the microbeam 116 results in an improvement of the axial thermal strain on the microbeam 116. The axial thermal strain on the microbeam 116 is mathematically expressed using Equation (6) provided below.

$$\varepsilon = \alpha_T \times \Delta T_{beam} \quad (6)$$

where $\alpha_T$ represents the CTE of the silicon material.

In an aspect, Joule heating induces a stress that is proportional to $I^2$, which reduces the resonant frequency until the buckling point is reached. Thus, the sensitivity is improved to TCF~$(\sigma, \varepsilon\sigma(T))^{-1/2}$.

A finite element model of the encapsulated MEMS temperature sensor 100 was built using the COMSOL FEM software (built by COMSOL, Inc. 100 District Avenue Burlington, MA 01803, USA) coupling the solid mechanics, electric currents, and heat transfer interfaces to explore the electrothermal-mechanical performance of the encapsulated MEMS temperature sensor 100. A simulation between the modules was performed to analyze the thermal stresses induced in the MEMS temperature sensor 100 by the current and simulate the mechanical behavior of the MEMS temperature sensor 100 at different temperatures.

Figure 13A:
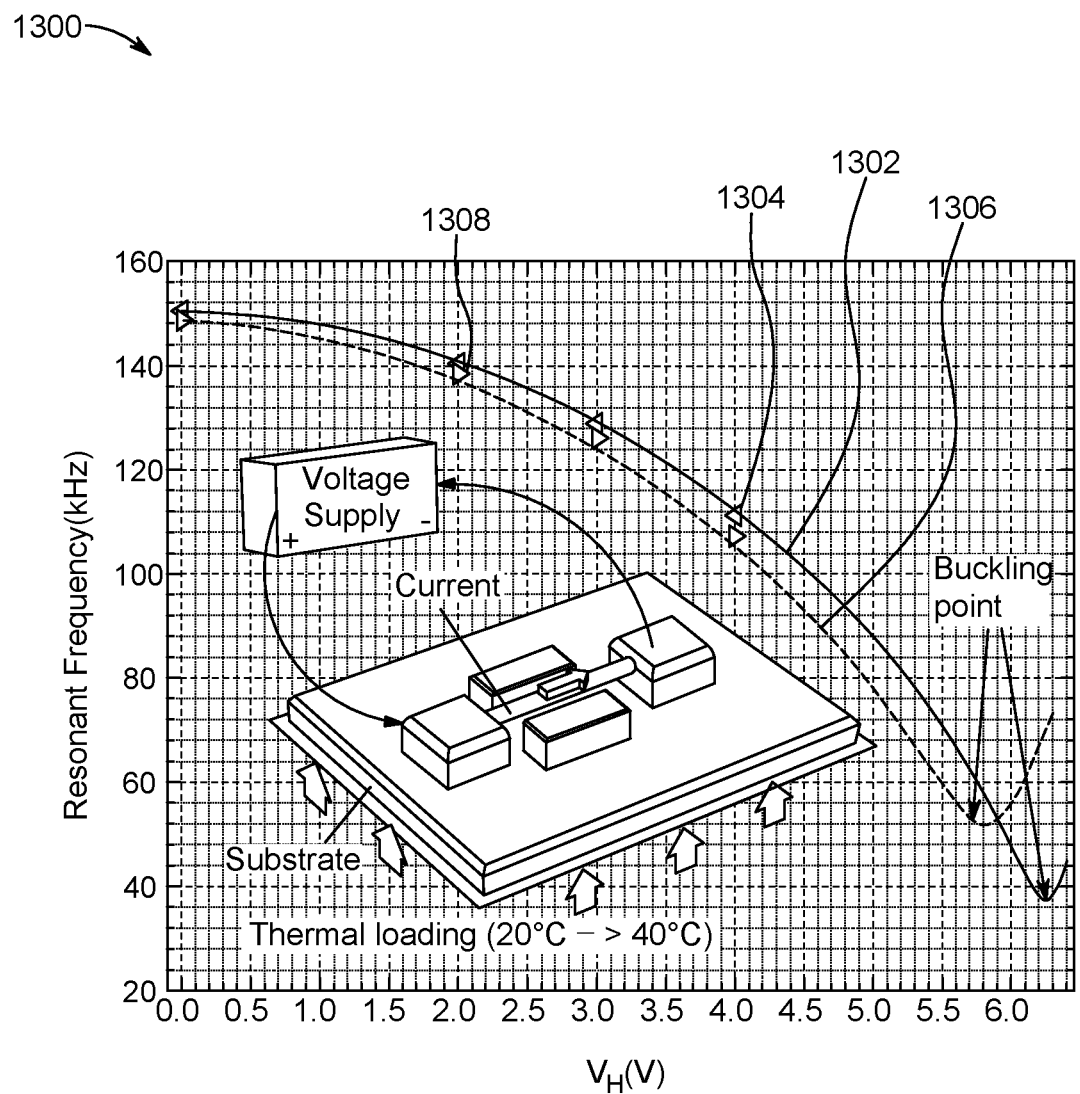
FIG. 13A demonstrates an example of simulated and experimental frequencies of the MEMS temperature sensor at different electrothermal voltages for varying temperatures, according to certain embodiments.
Figure 13B:
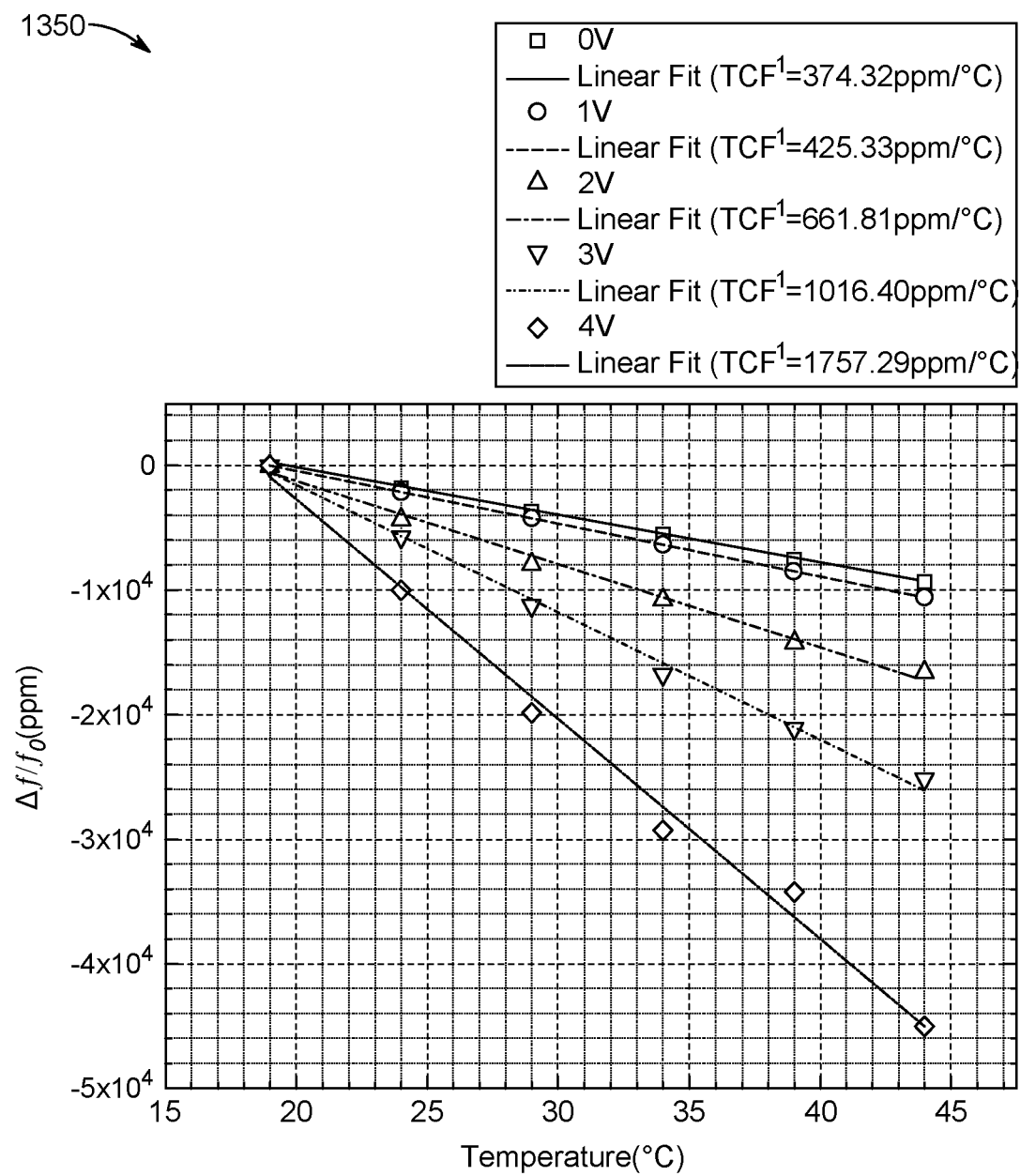
FIG. 13B shows a plot illustrating experimental results of normalized frequency changes of the MEMS temperature sensor at different electrothermal voltages, according to certain embodiments.

FIG. 13A and FIG. 13B demonstrates an example of frequency-tuning responsivity of the MEMS temperature sensor 100 to Joule heating.

In particular, FIG. 13A demonstrates an example 1300 of simulated and experimental resonant frequencies at different electrothermal (or thermal) voltages for substrate temperatures of 20 degree Celsius and 40 degree Celsius.

FIG. 13A shows the simulated and experimental resonant frequencies of the MEMS temperature sensor 100 heated using different electrothermal voltages (denoted as "$V_H$") applied to the first anchor 122 and the second anchor 124. Uncertainty in the material properties and fabrication process can account for differences in the experimental data and predicted simulation values. Plot line 1302 represents simulation results when the substrate temperature is 20 degrees Celsius and triangle 1304 represents experiment results when the substrate temperature is 20 degrees Celsius. Plot line 1306 represents simulation results when the substrate temperature is 40 degrees Celsius and triangle 1308 represents experiment results when the substrate temperature is 40 degrees Celsius.

In the simulation results, when the substrate temperature (denoted as "Tsub") is 20 degrees Celsius, the resonant frequency decreased with increased $V_H$ until 6.2 volts. Above 6.2 volts, the resonant frequency started to increase, indicating the entrance of the microbeam 116 into the post-buckling domain. When Tsub=40° C., the microbeam 116 buckled near 5.7 volts. The higher Tsub increased the induced thermal strain, which increased the central deflection and thus reduced $V_H$ at which buckling occurer. As shown in FIG. 13A, at 40 degrees Celsius, when $V_H$ increased from 0 volts to 5.7 volts, the temperature-dependent frequency shift was more dramatic as it approached the buckling point (5.7 volts). The responsivity can reach 554.7 Hz/° C. but with a reduced linear thermal sensing range (for example, in a range of about 20 degrees Celsius to 40 degrees Celsius).

Furthermore, at 6.18 volts (post-buckling region), increasing Tsub from 20 degrees Celsius to 40 degrees Celsius increased the bending and stretching of the MEMS temperature sensor 100, which increased the buckling resonant frequency from 37 kHz to 52 kHz, resulting in a further improved responsivity of 1.396 kHz/° C. As the experimental results illustrated in FIG. 13A show, the responsivity of the MEMS temperature sensor 100 can be increased by cautiously increasing the thermal strain induced by a DC current which matches the simulation DC current. In the experiment results, at an electrothermal voltage of 4 volts, the responsivity of frequency to temperature reacheed 196 Hz/° C., which is higher than when no electrothermal voltage was applied (i.e., 58 Hz/° C.).

FIG. 13B illustrates a plot 1350 depicting experimental results of normalized frequency changes of the MEMS temperature sensor 100 at different electrothermal voltages. The electrothermal voltage was varied from 0 volt to 4 volt with steps of 1 volt to investigate the effect of the electrothermal voltage on the thermal sensitivity of the MEMS temperature sensor 100. The TCF of the MEMS temperature sensor 100 was extracted using Equation (7) provided below.

$$TCF^n = \frac{1}{f} \frac{\partial^n f}{\partial T^n} \quad (7)$$

Linear fitting of the normalized frequency shift showed that the MEMS temperature sensor 100 maintained a linear frequency-temperature relationship at various electrothermal voltages values (0 volts to 4 volts). The resonant frequency without the application of electrothermal voltage has a linear temperature dependency, and the MEMS temperature sensor 100 has a sensitivity of 374.32 ppm/° C., which is 12 times higher than the intrinsic TCF value of −30 ppm. This improvement can be attributed to the mismatch in the CTEs of the package materials. Increasing the thermal voltage to 2 volts tuned the room-temperature (for example, 20 degrees Celsius) resonant frequency to 140 kHz. A temperature change ΔTsub=5° C. resulted in a frequency shift of −500 Hz, which corresponds to a sensitivity of 661.8 ppm/° C. The improved sensitivity is attributed to the additional induced localized stresses via Joule heating. When electrothermal voltage was increased to 4 volts, the resonant frequency at 20 degrees Celsius further decreased to 112 kHz. The temperature change ΔTsub=5° C. at the substrate 110 resulted in a frequency shift of Δf≈980 Hz. Consequently, the responsivity improved to 196 Hz/° C. and the TCF improved to 1.76×103 ppm/° C., which is higher than conventional temperature sensors.

Figure 14A:
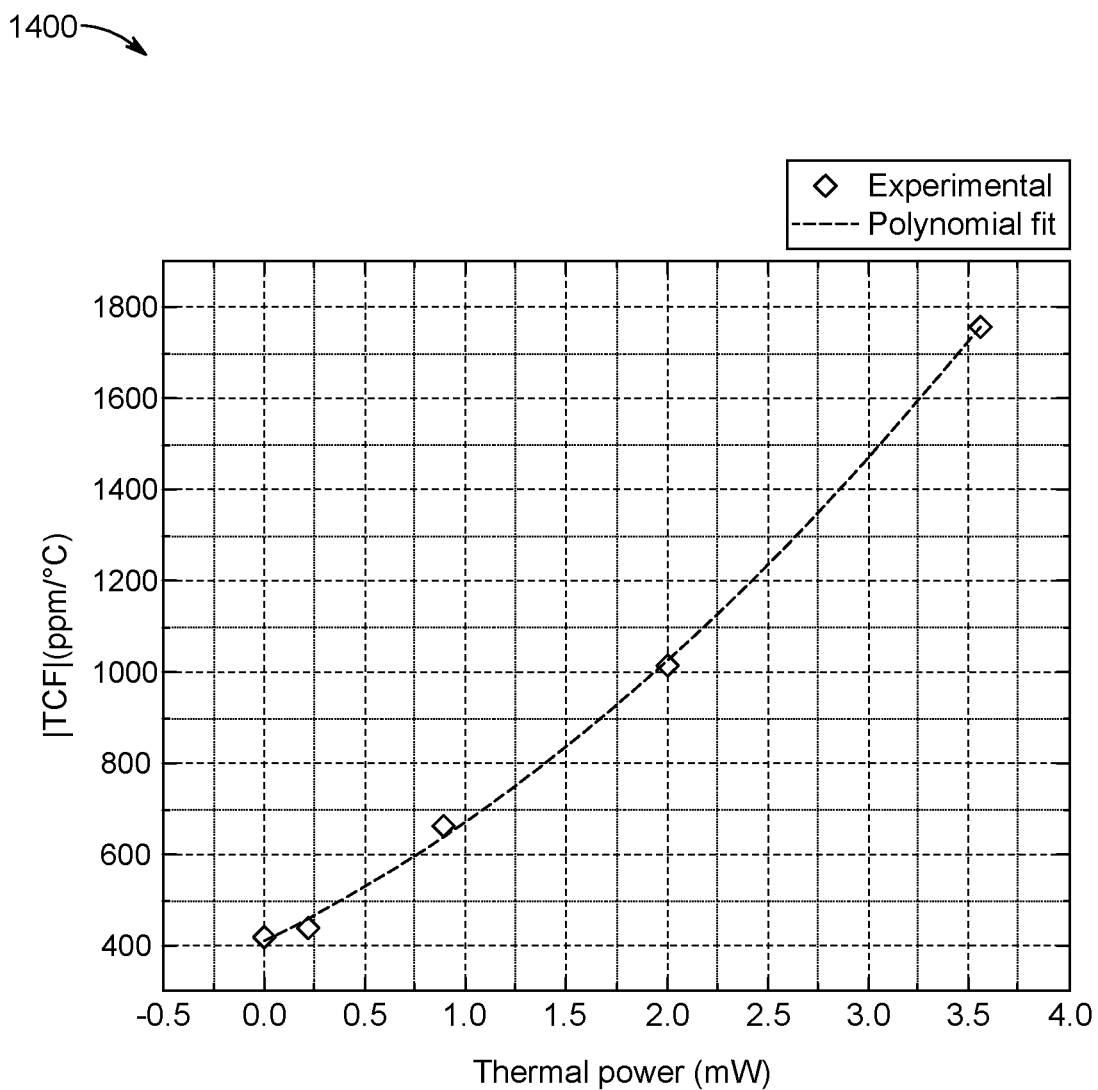
FIG. 14A shows a graphical plot demonstrating temperature coefficient of frequency (TCF) values of the MEMS temperature sensor with varying thermal power, according to certain embodiments.

FIG. 14A shows a graphical plot 1400 demonstrating TCF values of the MEMS temperature sensor 100 with varying thermal power.

In order to observe the effect of thermal power consumption on sensitivity of the MEMS temperature sensor 100, the TCF was plotted against the power consumption, as shown in FIG. 14A. The power consumption was calculated using Equation (8) provided below.

$$P = \frac{V_H^2}{R} \qquad (8)$$

where R is the resistance of the MEMS temperature sensor 100, which was measured as ~4500 Ω. The results indicate that increasing the thermal power causes the first-order TCF to increase as a quadratic polynomial. The TCF initially increased relatively slowly and then increased rapidly with increasing thermal power. When the thermal power increased from 0.44 mW to 2 mW, the sensitivity was improved by 197%, so that the sensitivity change was about ΔTCF≈500 ppm/° C. By increasing the thermal power from 2 to 3.56 mW, the sensitivity was improved with ΔTCF≈730 ppm/° C. Consequently, the TCF value rose relatively slowly and then rose rapidly as the thermal power increases. These results demonstrate that the sensitivity of the MEMS temperature sensor 100 can be tuned flexibly and precisely by adjusting the applied thermal power. In the MEMS temperature sensor 100, which has a small air gap, limiting the applied thermal voltage is necessary to protect the microbeam 116 from collapsing. Accordingly, increasing the air-gap size is desirable to explore the potential TCF value of the MEMS temperature sensor 100. According to the fitted polynomial equation, increasing the applied power to 6.72 mW (corresponding to $V_H$=5.5V) increased the sensitivity of the MEMS temperature sensor 100 to ~4×103 ppm/° C. As shown in FIG. 14A, R-square value=0.9991 and parameter y=45.17x²+216.91x+412.23.

Figure 14B:
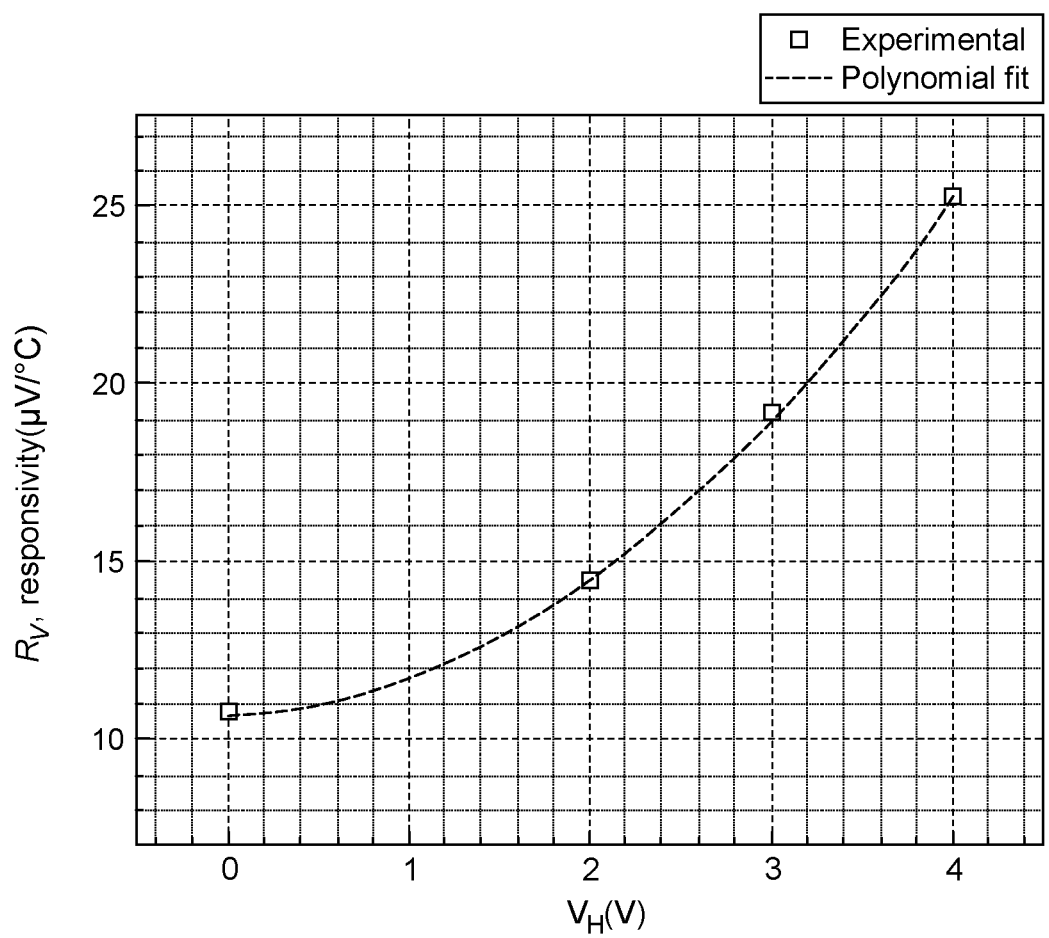
FIG. 14B shows a graphical plot demonstrating a responsivity of a voltage amplitude to an applied electrothermal voltage, according to certain embodiments.

FIG. 14B shows a graphical plot 1410 demonstrating the responsivity of the voltage amplitude (denoted as "$R_V$") to the applied electrothermal voltage (denoted as "$V_H$"). In particular, FIG. 14B demonstrates responsivity values of the MEMS temperature sensor 100 for different values of electrothermal voltage including 0 volt, 2 volt, 3 volt, and 4 volt.

Figure 14C:
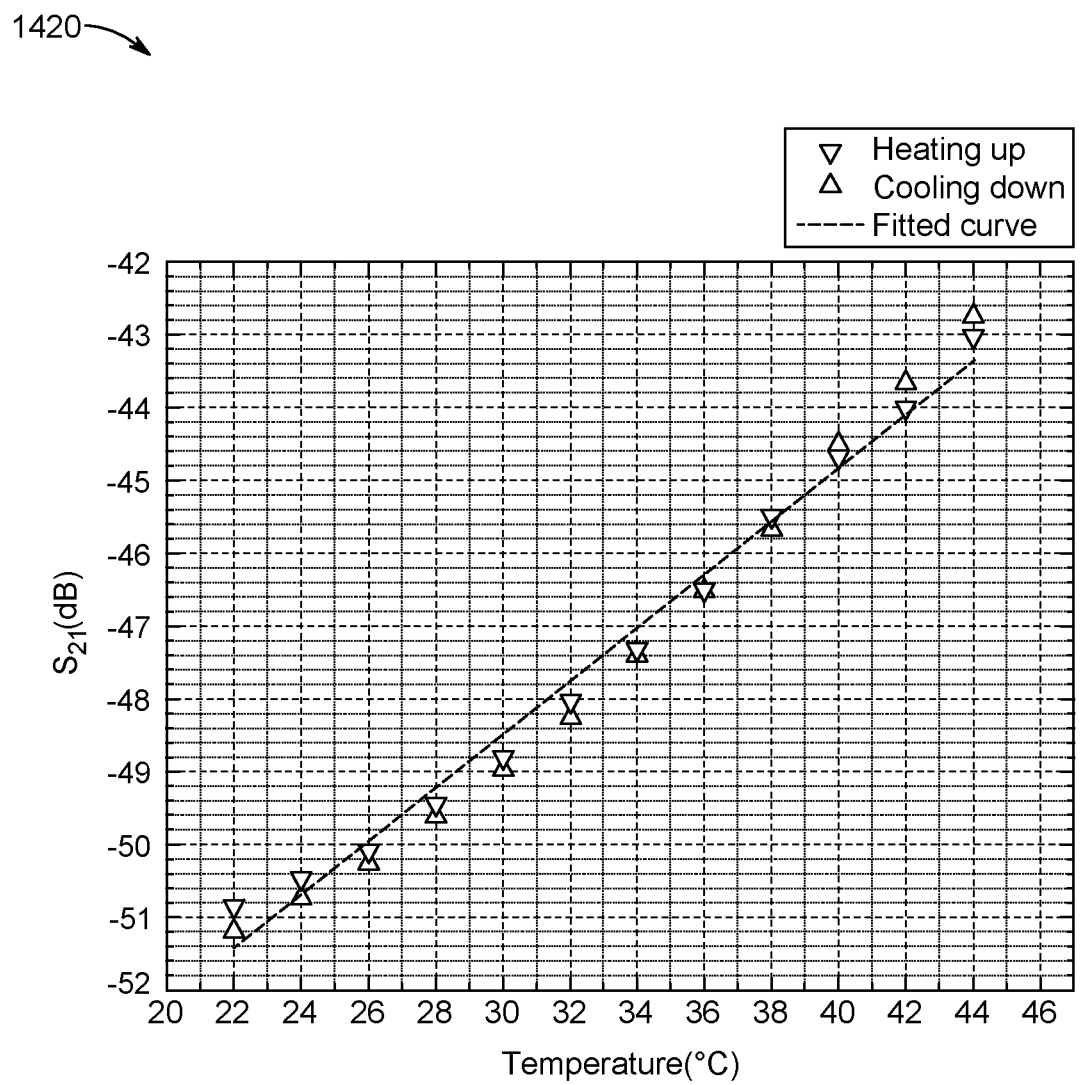
FIG. 14C shows a graphical plot demonstrating measured $S_{21}$ parameter hysteresis loops versus temperature at a fixed drive frequency, according to certain embodiments.

FIG. 14C shows a graphical plot 1420 demonstrating measured $S_{21}$ parameter hysteresis loops versus temperature at a fixed drive frequency of 178.942 kHz.

An experiment was performed to check the resonant frequency hysteresis, which is essential for assessing the consistency of the output of the MEMS temperature sensor 100 over a prolonged operating period. In the experiment, the temperature was increased and decreased in subsequent temperature ramps, and the frequency variations were represented by the $S_{21}$ parameter hysteresis. In the first increase process, the temperature was raised from 22 degrees Celsius to 44 degrees Celsius in steps of 2 degrees Celsius. After the temperature reached 44 degrees Celsius and $S_{21}$ parameters were measured, the temperature decreased to 22 degrees Celsius to start a ramp down with steps of 2 degrees Celsius until returning to 22 degrees Celsius. Thus, the $S_{21}$ parameters were measured in the two temperature-changing processes. The difference between the amplitude (or $S_{21}$) recorded for a specific temperature during ramping up (or heating up) and ramping down (or cooling down) represents the changes in the resonant frequency upon cycling (i.e., frequency hysteresis), which can be attributed to residual stresses in the MEMS temperature sensor 100 and its package. The temperature response hysteresis is defined as the ratio of the maximum lagged frequency variation and the overall frequency range.

FIG. 14C shows that the maximum temperature hysteresis of the MEMS temperature sensor 100 is only 0.3 degree Celsius at 42 degree Celsius. The frequency fluctuation at different temperatures was recorded to analyze the frequency stability of the MEMS temperature sensor 100, which also determines the resolution of the MEMS temperature sensor 100. The Allan deviation was used to analyze the noise in the frequency and characterize the frequency stability. The Allan deviation is calculated as a root of the variance in the time domain of the measured frequency averaged over a time interval (τ).

Figure 14D:
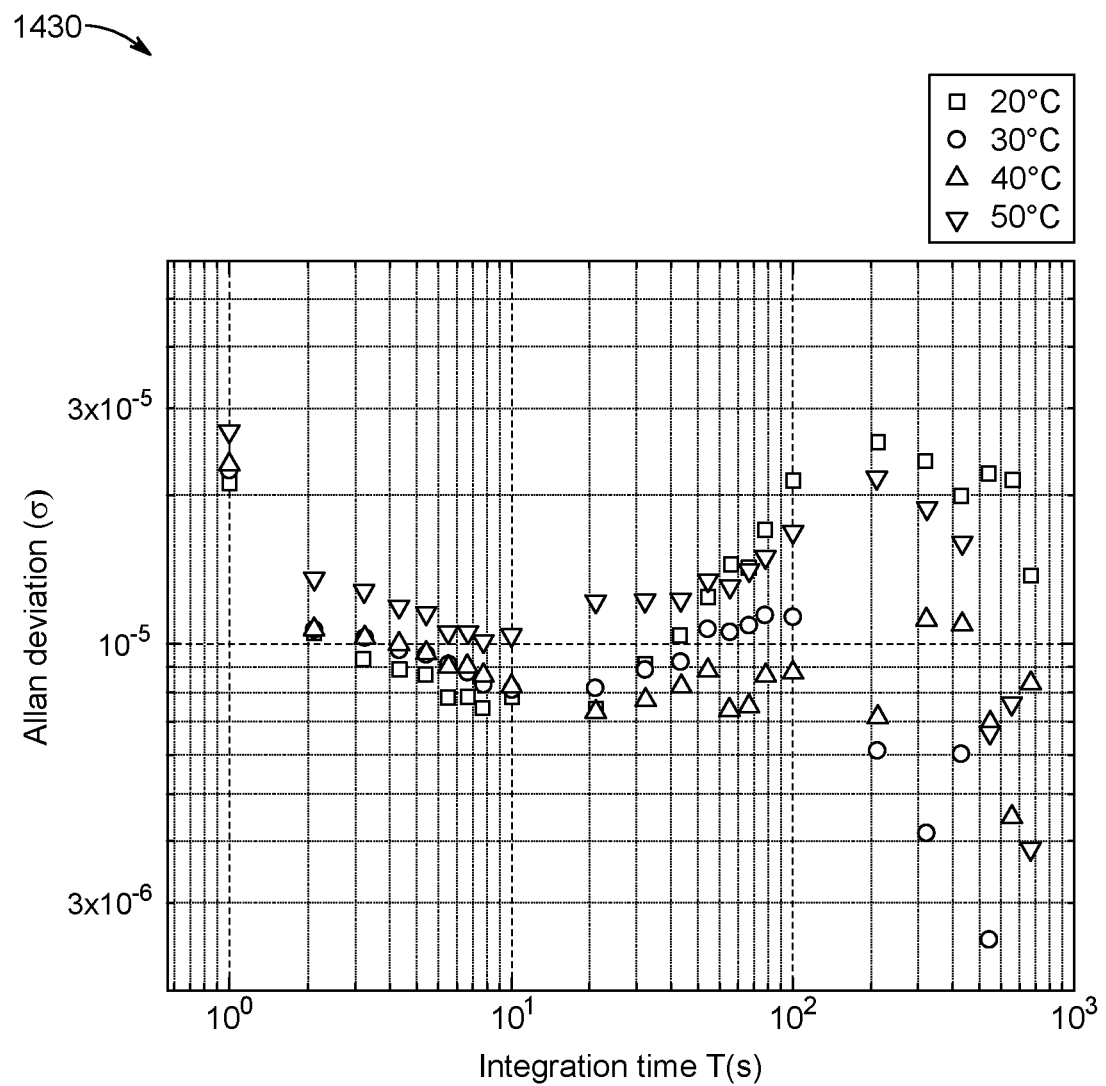
FIG. 14D shows a graphical plot demonstrating measured Allan deviation for different temperatures, according to certain embodiments.

FIG. 14D shows a graphical plot 1430 demonstrating measured Allan deviation for different temperatures.

According to an aspect, as shown in FIG. 14D, the Allan deviation was measured at 20 degrees Celsius, 30 degrees Celsius, 40 degrees Celsius, and 50 degrees Celsius. The MDT change was theoretically determined by calculating the Allan deviation from the noise measurements and is expressed as:

$$MDT = \frac{\sigma_A}{TCF} \qquad (8)$$

The Allan deviation results indicated three main contributions to noise including white noise for a short integration time, thermal drift for a long integration time, and flicker noise. At 40 degrees Celsius, the slope approached zero at an integration time of ~10 s, which implies that the flicker noise contribution was 0.009 degrees Celsius. The MDT was 0.0196 degrees Celsius for an integration time of ~20 s. The maximum frequency stability was achieved at an integration time of τ=9-20 seconds with a corresponding MDT in a range of 0.0196° C.-0.027° C. depending on the operating temperature. These values imply that the MEMS temperature sensor 100 offers a better resolution than conventional temperature sensors. The frequency noise limits the resolution of the MEMS temperature sensor 100, and it is mainly induced by temperature fluctuations and thermomechanical noise. The temperature fluctuation is given by the heat capacity of the MEMS temperature sensor 100. The temperature fluctuation is mathematically expressed as:

$$\Delta T_n^2 = \frac{K_B T^2}{C} \qquad (9)$$

where $K_B$ represents Boltzmann constant and C represents the harmonic mean of the heat capacity of the MEMS temperature sensor 100.

Accordingly, the temperature fluctuations can be reduced by increasing the heat capacity (i.e., dimensions) of the MEMS temperature sensor 100. The ultimate performance of the MEMS temperature sensor 100 is limited by thermomechanical noise. This can be suppressed by improving the quality factor, which in turn increases the temperature resolution.

According to aspects of the present disclosure, to better assess the performance of the MEMS temperature sensor 100, the main features of the MEMS temperature sensor 100 are compared with conventional temperature sensors. These main features of the MEMS temperature sensor 100 include area, minimum detectable temperature (MDT), temperature coefficient of frequency (TCF), and temperature sensing range. The sensitivity of the MEMS temperature sensor 100 is 3 times higher than the those exhibited by the conventional temperature sensor D with three orders of magnitude less footprint. The MDT value implies that the MEMS temperature sensor 100 offers a higher temperature resolution compared with conventional temperature sensors.

Besides, the the MEMS temperature sensor 100 shows high linearity and frequency stability within a wide temperature sensing range.

TABLE 1

Performance comparison of the MEMS temperature sensor 100 and conventional temperature sensors

| Material | MEMS Temperature Sensor 100 Encapsulated silicon | Conventional Temperature Sensor A silicon nitride | Conventional Temperature Sensor B Shape memory polymer | Conventional Temperature Sensor C silicon nitride | Conventional Temperature Sensor D Encapsulated silicon |
|---|---|---|---|---|---|
| Area | 600 um$^2$ | 12 um$^2$ | 857168 um$^2$ | 90000 um$^2$ | 1410000 um$^2$ |
| MDT | 19.6 mK | 390 mK | 400 mK | — | 12.3 mK |
| \|TCF\| | 1757 ppm/° C. | 548 ppm/° C. | 16000 ppm/° C. | 334 ppm/° C. | 604 ppm/° C. |
| Range | 20° C. to 125° C. | NA | 25° C. to 50° C. | −25° C. to 100° C. | −25° C. to 60° C. |

Figure 15:
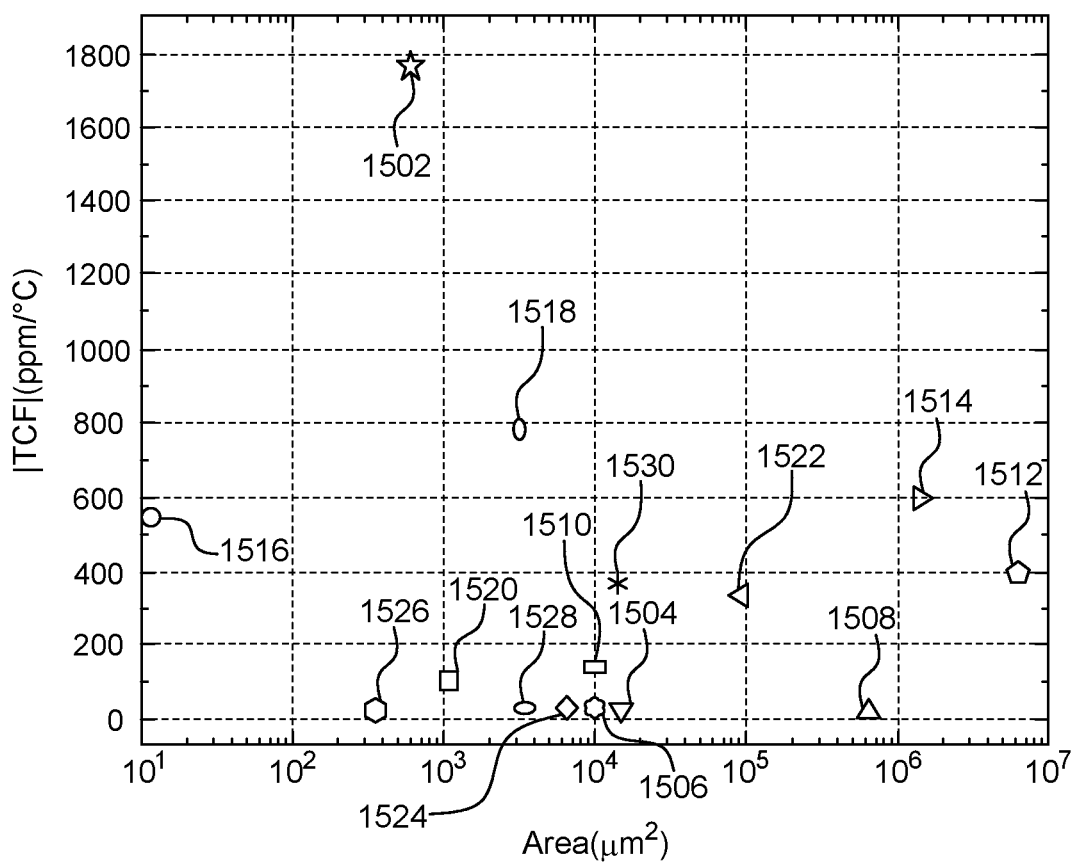
FIG. 15 shows a graphical plot demonstrating performance of the MEMS temperature sensor in comparison to conventional temperature sensors, according to certain embodiments.

FIG. 15 shows a graphical plot 1500 demonstrating performance of the MEMS temperature sensor 100 compared with conventional temperature sensors.

In FIG. 15, reference number 1502 refers to the MEMS temperature sensor 100, reference number 1504 refers to J. Tao et al., reference number 1506 refers to X. Li et al., reference number 1508 refers to H. Zhu et al., reference number 1510 refers to M. Moosavifar et al., reference number 1512 refers to M. Reusch et al., reference number 1514 refers to T. Kose et al., reference number 1516 refers to X. C. Zhang et al., reference number 1518 refers to T. Larsen et al., reference number 1520 refers to L. Li et al., reference number 1522 refers to H. Campanella et al., reference number 1524 refers to V. J. Gokhale et al., reference number 1526 refers to A. Cagliani et al., reference number 1528 refers to M. A. Hoperoft et al., reference number 1530 refers to C. M. Jha et al (See: J. Tao et al., "Dual functionality metamaterial enables ultra-compact, highly sensitive uncooled infrared sensor," Nanophotonics, vol. 10, no. 4, pp. 1337-1346, February 2021; X. Li et al., "Resonant and resistive dual-mode uncooled infrared detectors toward expanded dynamic range and high linearity," Appl. Phys. Lett., vol. 110, no. 26, June 2017, Art. no. 263502; H. Zhu, C. Tu, G. Shan, and J. E.-Y. Lee, "Dependence of temperature coefficient of frequency (TCf) on crystallography and eigenmode in N-doped silicon contour mode micromechanical resonators," Sensors Actuators A, Phys., vol. 215, pp. 189-196, August 2014; M. Moosavifar, A. Ansari, and M. Rais-Zadeh, "An AlN-on-Si resonant IR sensor array with a large temperature coefficient of frequency," in Proc. IEEE SENSORS, November 2016, pp. 1-3; M. Reusch, K. Holc, V. Lebedev, N. Kurz, A. ukauskaite, and O. Ambacher, "Temperature cross-sensitivity of AlN-based flexural plate wave sensors," IEEE Sensors J., vol. 18, no. 19, pp. 7810-7818, October 2018;T. Kose, K. Azgin, and T. Akin, "Design and fabrication of a high performance resonant MEMS temperature sensor," J. Micromech. Microeng., vol. 26, no. 4, April 2016, Art. no. 045012; X. C. Zhang, E. B. Myers, J. E. Sader, and M. L. Roukes, "Nanomechanical torsional resonators for frequency-shift infrared thermal sensing," Nano Lett., vol. 13, no. 4, pp. 1528-1534, Apr. 10, 2013; T. Larsen et al., "Ultrasensitive string-based temperature sensors," Appl. Phys. Lett., vol. 98, no. 12, March 2011, Art. no. 121901; L. Li et al., "A novel design method for SAW temperature sensor with monotonic and linear frequency-temperature behavior in wide temperature range," Sensors Actuators A, Phys., vol. 307, June 2020, Art. no. 111982; H. Campanella, M. Narducci, S. Merugu, and N. Singh, "Dual MEMS resonator structure for temperature sensor applications," IEEE Trans. Electron. Devices, vol. 64, no. 8, pp. 3368-3376, August 2017; V. J. Gokhale and M. Rais-Zadeh, "Uncooled infrared detectors using gallium nitride on silicon micromechanical resonators," J. Microelectro-mech. Syst., vol. 23, no. 4, pp. 803-810, August 2014; A. Cagliani, V. Pini, J. Tamayo, M. Calleja, and Z. J. Davis, "Ultrasensitive thermometer for atmospheric pressure operation based on a micromechanical resonator," Sensors Actuators B, Chem., vol. 202, pp. 339-345, October 2014; M. A. Hoperoft et al., "Using the temperature dependence of resonator quality factor as a thermometer," Appl. Phys. Lett., vol. 91, no. 1, July 2007, Art. no. 013505; C. M. Jha et al., "High resolution microresonator-based digital temperature sensor," Appl. Phys. Lett., vol. 91, no. 7, August 2007, Art. no. 074101, each incorporated herein by reference in its entirety)

To assess the performance of the MEMS temperature sensor 100, TCF and footprint of the MEMS temperature sensor 100 was compared with conventional temperature sensors. As shown in FIG. 15, the MEMS temperature sensor 100 had the highest TCF value, which was twice that of the conventional temperature sensor described in H. Campanella et al. Additionally, the MEMS temperature sensor 100 had a smaller footprint than most of the conventional temperature sensors. The MEMS temperature sensor 100 has the simplest readout circuits among all of the conventional temperature sensors. Most of the conventional temperature sensors required complex and expensive readout schemes to detect the output, e.g., laser Doppler vibrometer and mixer circuits. However, the MEMS temperature sensor 100 can be read out by tracking the voltage output directly due to the low parasitic signal of the microbeam 116. This voltage amplitude tracking method simplifies the bulky frequency-tracking system and paves a way to integrate the measurement set-up on chip to minimize the sensing system complexity. Thus, the MEMS temperature sensor 100 is a good candidate for temperature sensing applications owing to its high sensitivity and resolution, compact size, and practical readout scheme. Beam fatigue and fracture due to cyclic load might limit the number of loading cycles and the fatigue life. In the experiments, when small thermal currents were applied through the microbeam 116, the microbeam 116 was cycled a few times without collapsing. However, when the current was increased to increase the temperature sensing sensitivity, the microbeam 116 was pulled-in due to the very small airgap separation between the microbeam 116 and the side electrodes. The fatigue life of the MEMS temperature sensor 100 can be improved by either reducing the required driving force amplitude or increasing the microbeam 116 dimension. The driving force is related to the stiffness of the deformable beam and reducing the force requires considering components having lower stiffness indices.

The MEMS temperature sensor 100 demonstrated a high sensitivity of 1757 ppm/° C. with a low power dissipation of 3.56 mW. The encapsulated MEMS temperature sensor 100 exhibited an MDT change of 0.0196° C. Because of its small size, good linearity and temperature resolution, frequency stability, and enhanced sensitivity, the MEMS temperature sensor 100 shows great potential for various practical applications. Strain is induced by Joule heating with electric current passing through the microbeam 116, which forces the MEMS temperature sensor 100 to approach the buckling zone. The MEMS temperature sensor 100 achieves ultrahigh sensitivity and prevents a complex structural design. By operating the MEMS temperature sensor 100 at a fixed resonant frequency, variations in temperature can be monitored easily and precisely according to the output voltage amplitude. Moreover, the MEMS temperature sensor 100 performs high resolution of a low minimum detectable temperature change value with an ultra-compact footprint. Since the MEMS temperature sensor 100 is fabricated by the X-FAB foundry using XMB10 technology and is vacuum-encapsulated, the MEMS temperature sensor 100 can be used directly in an atmospheric environment without pressure compensation and avoid temperature-induced pressure fluctuations.

The first embodiment is illustrated with respect to FIGS. 1-15. The first embodiment describes a MEMS temperature sensor 100. The MEMS temperature sensor 100 includes a cavity wafer 102 configured with an air cavity region 104, where the air cavity region 104 is configured with cavity sides 106 and a bottom surface 108. The MEMS temperature sensor 100 includes a metal layer 112 located on the bottom surface 108 of the air cavity region 104, and a membrane wafer 114 located over the cavity wafer 102, where the membrane wafer 114 is configured with a microbeam 116, the microbeam 116 having a first end 118 and a second end 120, where the microbeam 116 is located over the air cavity region 104. The membrane wafer 114 is configured with a first anchor 122 attached to the first end 118 and a second anchor 124 attached to the second end 120. The membrane wafer 114 is configured with a drive electrode 126 located on a substrate 110 on a first side of the microbeam 116 near the first end 118, and a sense electrode 128 located on the substrate 110 at a second side of the microbeam 116 near the second end 120. The membrane wafer 114 is configured with a first ground electrode 130 adjacent to the drive electrode 126 on the first side near the second end 120, and a second ground electrode 132 adjacent to the sense electrode 128 on the second side near the first end 118. The membrane wafer 114 is configured with a first metallic feed line 134 connected at a first terminal to the drive electrode 126 and at a second terminal to a first side electrode pad, a second metallic feed line 136 connected at a first terminal to the first anchor 122 and at a second terminal to a second side electrode pad, a third metallic feed line 138 connected at a first terminal to the second ground electrode 132 and at a second terminal to a third side electrode pad, a fourth metallic feed line 140 connected to a fourth side electrode pad, a fifth metallic feed line 142 connected at a first terminal to the sense electrode 128 and at a second terminal to a fifth side electrode pad, a sixth metallic feed line 144 connected at a first terminal to the second anchor 124 and at a second terminal to a sixth side electrode pad, and a seventh metallic feed line 146 connected at the first terminal to the second ground electrode 132 and at a second terminal to a seventh side electrode pad, where each of the side electrode pads are adjacent to one another and parallel to the microbeam 116. The MEMS temperature sensor 100 includes a capping wafer 150 located over and encapsulating the cavity wafer 102 and membrane wafer 114, where the side electrode pads are exposed. The MEMS temperature sensor 100 includes an aluminum layer 151 configured to cover periphery of the MEMS temperature sensor 100, while leaving the side electrode pads exposed. The MEMS temperature sensor 100 includes an alternating current (AC) source 152 connected to the first side electrode pad, a DC bias voltage source 154 connected to the second side electrode pad, and a ground 156 connected to the third side electrode pad, the fourth side electrode pad, the sixth side electrode pad and the seventh side electrode pad, where the microbeam 116 is configured to vibrate at a resonant frequency related to a temperature surrounding the MEMS temperature sensor 100 when an AC current is applied to the drive electrode 126 and the DC bias voltage is applied to the first anchor 122, where the sense electrode 128 is configured to capacitively sense the vibration and generate an induced current based on the resonant frequency. The MEMS temperature sensor 100 includes a multimeter 160 connected to the fifth side electrode pad, where the multimeter 160 is configured to measure the induced current. The MEMS temperature sensor 100 includes a computing device 162 connected to the multimeter 160, where the computing device 162 is configured with a display 164 and a database 166 including records relating induced current values to temperature values, where the computing device 162 is configured to search the database 166 to match the induced current to a temperature value and display the temperature value on the display 164.

The MEMS temperature sensor 100 further comprises a substrate 110 located below the cavity wafer 102, where the substrate 110 is connected to the fourth side electrode pad.

The aluminum layer 151 of the MEMS temperature sensor 100 is connected to the fourth side electrode pad.

The microbeam 116 of the MEMS temperature sensor 100 has a length of about 300 microns, a width of about 2 microns and a thickness of about 30 microns.

The air cavity region 104 of the MEMS temperature sensor 100 is preferably about 50 microns deep.

Each of the drive electrode 126, the sense electrode 128, the first ground electrode 130, and the second ground electrode 132 are preferably spaced about 2 microns from the microbeam 116 and from each other A relationship between the induced current and the temperature is linear within a temperature range of about 30 degree Celsius to 60 degree Celsius.

The resonant frequency is inversely proportional to the temperature.

The DC bias voltage is about 20 volts and the AC current is about −32 dBm and has a fixed frequency.

Dimensions of the encapsulated MEMS temperature sensor 100 are a length of about 3 mm, a width of about 2 mm and a height of about 1 mm.

The MEMS temperature sensor 100 further includes a rectangular wall 148 located on the membrane wafer 114, where the rectangular wall 148 is configured to surround the microbeam 116, the first anchor 122, the second anchor 124, the drive electrode 126, the sense electrode 128, the first ground electrode 130 and the second ground electrode 132, wherein a portion of the rectangular wall 148 adjacent to the first side electrode pad, the second side electrode pad, the third side electrode pad and the fourth side electrode pad includes a plurality of vias configured to pass the first metallic feed line 134, the second metallic feed line 136, the third metallic feed line 138 and the fourth metallic feed line 140 respectively through the portion of the rectangular wall 148.

The capping wafer 150 is configured to vacuum encapsulate the rectangular wall 148 and the membrane wafer 114.

The rectangular wall 148 is etched from a layer of silicon dioxide deposited on the membrane wafer 114 before the membrane wafer 114 is configured.

The second embodiment is illustrated with respect to FIGS. 1-15. The second embodiment describes a method of using a MEMS temperature sensor 100. The method comprises applying, by an alternating current (AC) source 152, a fixed frequency alternating current (AC) to a drive electrode 126, applying, by a DC bias voltage source 154, a DC bias voltage to a first anchor 122 of a microbeam 116, connecting a ground 156 to a second anchor 124 of the microbeam 116, to a first ground electrode 130 adjacent to the drive electrode 126, to a second ground electrode 132 adjacent to a sense electrode 128, to a substrate 110 of the MEMS temperature sensor 100 and to an aluminum layer 151 encapsulating the MEMS temperature sensor 100, measuring, by a multimeter 160, an induced current at the sense electrode 128 over a frequency range, receiving, by a computing device 162 connected to the multimeter 160, the induced current, determining, by the computing device 162, a resonant frequency of the induced current based on a magnitude of the induced current, searching, by the computing device 162, a database 166 containing records induced current values at each resonant frequency to temperature values, matching the induced current and determined resonant frequency to a temperature value, and displaying, on a display 164, the temperature value.

The temperature values within a temperature range of about 30 degree Celsius to 60 degree Celsius are linearly related to the induced current.

The DC bias voltage is applied at about 20 volts and the AC current is applied at about −32 dBm and at a fixed frequency.

The third embodiment is illustrated with respect to FIGS. 1-15. The third embodiment describes a method of making a MEMS temperature sensor 100. The method comprises depositing a cavity wafer 102 on a substrate 110, etching, by lithographic etching, an air cavity region 104 into the cavity wafer 102, where the air cavity region 104 is configured with cavity sides 106 and a bottom surface 108. The method comprises masking and depositing, by electronic vapor deposition, a metal on the bottom surface 108, removing the mask, depositing a membrane wafer 114 on the cavity wafer 102, depositing a layer of silicon dioxide over the membrane wafer 114, and performing an isotropic etch process to form rectangular walls 148 around an area of the membrane wafer 114 while masking the membrane wafer 114. The method includes forming, by lithographic etching, a microbeam 116 in the membrane wafer 114 over the air cavity region 104, forming, by etching, a first anchor 122 at a first end 118 of the microbeam 116 and a second anchor 124 at a second end 120 of the microbeam 116, forming a masking pattern over the membrane wafer 114, depositing, by electronic vapor deposition of aluminum, a drive electrode 126 on a first side of the microbeam 116, a first ground electrode 130 on the first side of the microbeam 116, a sense electrode 128 on a second side of the microbeam 116, a second ground electrode 132 on the second side of the microbeam 116, a first anchor electrode on the first anchor 122, and a second anchor electrode on the second anchor 124. The method comprises depositing, by electronic vapor deposition of aluminum, a plurality of side electrode pads in a region of the membrane wafer 114 which is outside of the rectangular walls 148, depositing, by electronic vapor deposition of aluminum, a wiring pattern of metallic feed lines on the membrane wafer 114 within the area surrounding the rectangular walls 148, where the metallic feed lines are configured to connect each of the drive electrode 126, the first ground electrode 130, the sense electrode 128, the second ground electrode 132, the first anchor electrode, and the second anchor electrode to a respective side electrode pad, removing the masking pattern, encapsulating the rectangular walls 148, the membrane wafer 114 and the cavity wafer 102 with a capping wafer 150, while masking the side electrode pads, encapsulating the capping wafer 150 with an aluminum layer 151, and removing the masking from the side electrode pads.

The method comprises connecting an AC source 152 to a first side electrode pad connected by a first metallic feed line 134 to the drive electrode 126 of the plurality of side electrode pads, connecting a DC bias voltage source 154 to a second side electrode pad, connecting a ground 156 to a third side electrode pad and a fourth side electrode pad, connecting a multimeter 160 to a fifth side electrode pad, where the multimeter 160 is configured to measure an induced current over a frequency when the AC source 152 and the DC bias voltage source 154 are turned ON, and connecting the ground 156 to a sixth side electrode pad and to a seventh side electrode pad.

The method comprises connecting a computing device 162 to the multimeter 160, where the computing device 162 is configured for receiving the induced current, determining a resonant frequency of the induced current based on a magnitude of the induced current, searching a database 166 containing records induced current values at each resonant frequency to temperature values, matching the induced current and determined resonant frequency to a temperature value, and displaying, on a display 164, the temperature value.

The method comprises linearly relating the temperature values to the induced current within a temperature range of about 30 degree Celsius to 60 degree Celsius.

Figure 16:
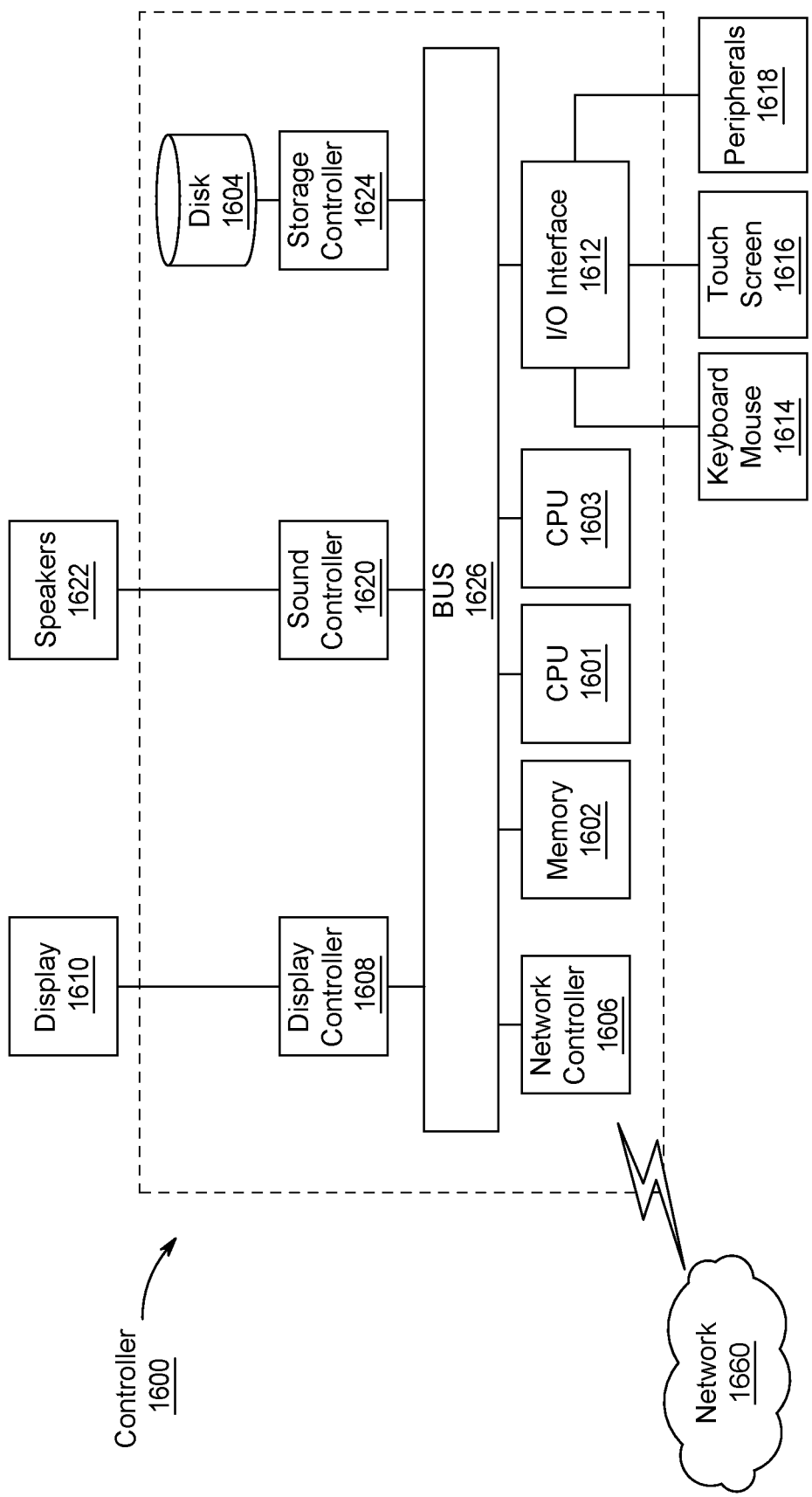
FIG. 16 is an illustration of a non-limiting example of details of computing hardware used in the computing system, according to certain embodiments.

Next, further details of the hardware description of the computing environment according to exemplary embodiments is described with reference to FIG. 16. FIG. 16 is an illustration of a non-limiting example of details of computing hardware used in the computing system, according to exemplary aspects of the present disclosure. In FIG. 16, a controller 1600 is described which is a computing device (for example, the computing device 162) and includes a CPU 1601 which performs the processes described above/below. The process data and instructions may be stored in memory 1602. These processes and instructions may also be stored on a storage medium disk 1604 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1601, 1603 and an operating system such as Microsoft Windows 7, Microsoft Windows 10, Microsoft Windows 11, UNIX, Solaris, LINUX, Apple MAC-OS and other systems known to those skilled in the art.

The hardware elements in order to achieve the computing device may be realized by various circuitry elements, known to those skilled in the art. For example, CPU 1601 or CPU 1603 may be a Xenon or Core processor from Intel of America or an Opteron processor from AMD of America, or may be other processor types that would be recognized by one of ordinary skill in the art. Alternatively, the CPU 1601, 1603 may be implemented on an FPGA, ASIC, PLD or using discrete logic circuits, as one of ordinary skill in the art would recognize. Further, CPU 1601, 1603 may be implemented as multiple processors cooperatively working in parallel to perform the instructions of the inventive processes described above.

The computing device in FIG. 16 also includes a network controller 1606, such as an Intel Ethernet PRO network interface card from Intel Corporation of America, for interfacing with network 1660. As can be appreciated, the network 1660 can be a public network, such as the Internet, or a private network such as an LAN or WAN network, or any combination thereof and can also include PSTN or ISDN sub-networks. The network 1660 can also be wired, such as an Ethernet network, or can be wireless such as a cellular network including EDGE, 3G, 4G and 5G wireless cellular systems. The wireless network can also be WiFi, Bluetooth, or any other wireless form of communication that is known.

The computing device further includes a display controller 1608, such as a NVIDIA GeForce GTX or Quadro graphics adaptor from NVIDIA Corporation of America for interfacing with display 1610, such as a Hewlett Packard HPL2445w LCD monitor. A general purpose I/O interface 1612 interfaces with a keyboard and/or mouse 1614 as well as a touch screen panel 1616 on or separate from display 1610. General purpose I/O interface also connects to a variety of peripherals 1618 including printers and scanners, such as an OfficeJet or DeskJet from Hewlett Packard.

A sound controller 1620 is also provided in the computing device such as Sound Blaster X-Fi Titanium from Creative, to interface with speakers/microphone 1622 thereby providing sounds and/or music. The general purpose storage controller 1624 connects the storage medium disk 1604 with communication bus 1626, which may be an ISA, EISA, VESA, PCI, or similar, for interconnecting all of the components of the computing device. A description of the general features and functionality of the display 1610, keyboard and/or mouse 1614, as well as the display controller 1608, storage controller 1624, network controller 1606, sound controller 1620, and general purpose I/O interface 1612 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 17.

Figure 17:
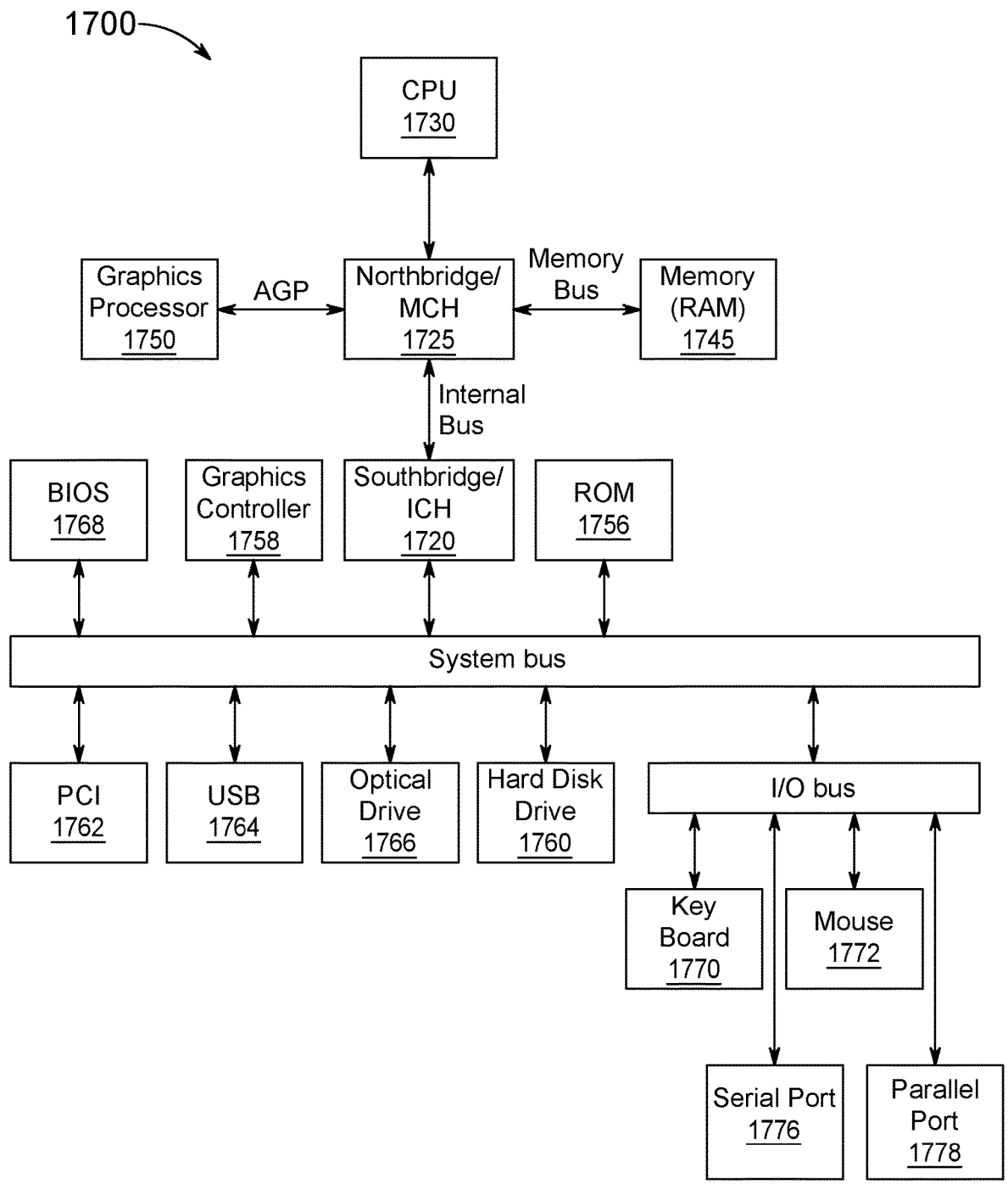
FIG. 17 is an exemplary schematic diagram of a data processing system used within the computing system, according to certain embodiments.

FIG. 17 shows a schematic diagram of a data processing system 1700, for performing the functions of the exemplary embodiments. The data processing system 1700 is an example of a computer in which code or instructions implementing the processes of the illustrative embodiments may be located.

In FIG. 17, data processing system 1700 employs a hub architecture including a north bridge and memory controller hub (NB/MCH) 1725 and a south bridge and input/output (I/O) controller hub (SB/ICH) 1720. The central processing unit (CPU) 1730 is connected to NB/MCH 1725. The NB/MCH 1725 also connects to the memory 1745 via a memory bus, and connects to the graphics processor 1750 via an accelerated graphics port (AGP). The NB/MCH 1725 also connects to the SB/ICH 1720 via an internal bus (e.g., a unified media interface or a direct media interface). The CPU Processing unit 1730 may contain one or more processors and even may be implemented using one or more heterogeneous processor systems.

Figure 18:
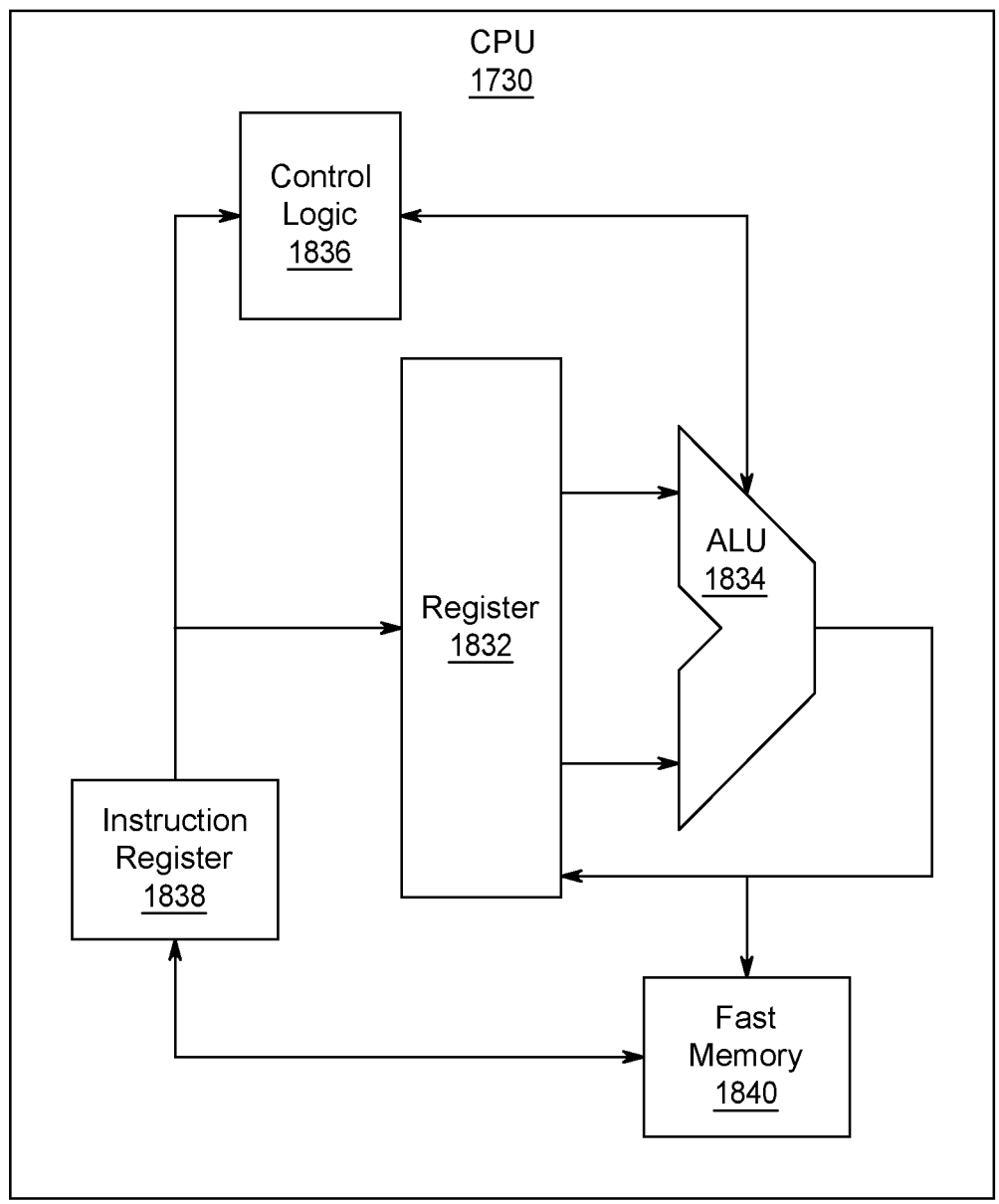
FIG. 18 is an exemplary schematic diagram of a processor used with the computing system, according to certain embodiments.

For example, FIG. 18 shows one implementation of CPU 1730. In one implementation, the instruction register 1838 retrieves instructions from the fast memory 1840. At least part of these instructions are fetched from the instruction register 1838 by the control logic 1836 and interpreted according to the instruction set architecture of the CPU 1830. Part of the instructions can also be directed to the register 1832. In one implementation, the instructions are decoded according to a hardwired method, and in another implementation, the instructions are decoded according to a microprogram that translates instructions into sets of CPU configuration signals that are applied sequentially over multiple clock pulses. After fetching and decoding the instructions, the instructions are executed using the arithmetic logic unit (ALU) 1834 that loads values from the register 1832 and performs logical and mathematical operations on the loaded values according to the instructions. The results from these operations can be feedback into the register and/or stored in the fast memory 1840. According to certain implementations, the instruction set architecture of the CPU 1730 can use a reduced instruction set architecture, a complex instruction set architecture, a vector processor architecture, a very large instruction word architecture. Furthermore, the CPU 1730 can be based on the Von Neuman model or the Harvard model. The CPU 1730 can be a digital signal processor, an FPGA, an ASIC, a PLA, a PLD, or a CPLD. Further, the CPU 1730 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 17, the data processing system 1700 can include that the SB/ICH 1720 is coupled through a system bus to an I/O Bus, a read only memory (ROM) 1756, universal serial bus (USB) port 1764, a flash binary input/output system (BIOS) 1768, and a graphics controller 1758. PCI/PCIe devices can also be coupled to SB/ICH 1720 through a PCI bus 1762.

The PCI devices may include, for example, Ethernet adapters, add-in cards, and PC cards for notebook computers. The Hard disk drive 1760 and CD-ROM 1756 can use, for example, an integrated drive electronics (IDE) or serial advanced technology attachment (SATA) interface. In one implementation, the I/O bus can include a super I/O (SIO) device.

Further, the hard disk drive (HDD) 1760 and optical drive 1766 can also be coupled to the SB/ICH 1720 through a system bus. In one implementation, a keyboard 1770, a mouse 1772, a parallel port 1778, and a serial port 1776 can be connected to the system bus through the I/O bus. Other peripherals and devices that can be connected to the SB/ICH 1720 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 19, in addition to various human interface and communication devices (e.g., display monitors, smart phones, tablets, personal digital assistants (PDAs)).

Figure 19:
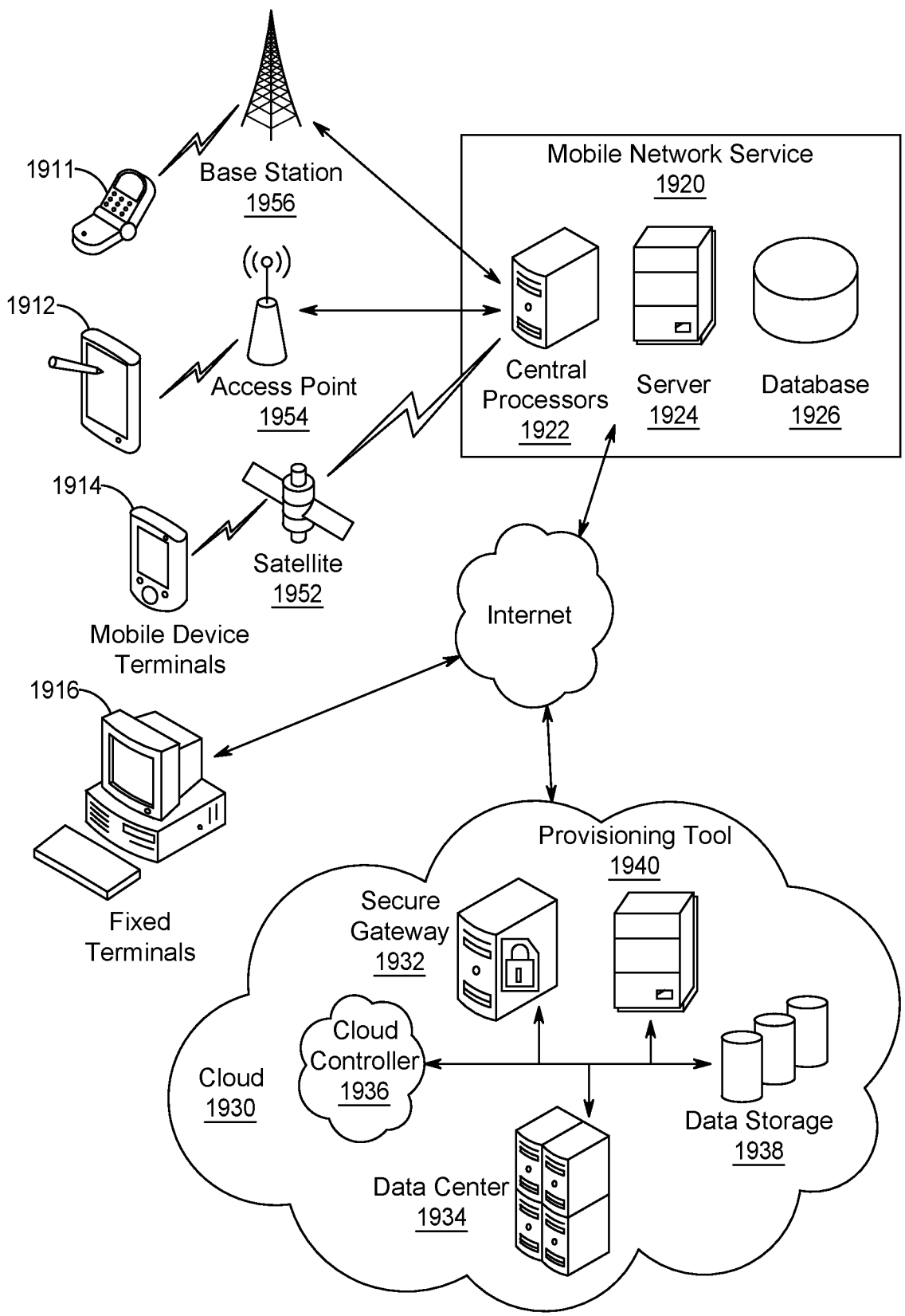
FIG. 19 is an illustration of a non-limiting example of distributed components which may share processing with the controller, according to certain embodiments.

More specifically, FIG. 19 illustrates client devices including a smart phone 1911, a tablet 1912, a mobile device terminal 1914 and fixed terminals 1916. These client devices may be commutatively coupled with a mobile network service 1920 via base station 1956, access point 1954, satellite 1952 or via an internet connection. Mobile network service 1920 may comprise central processors 1922, a server 1924 and a database 1926. Fixed terminals 1916 and mobile network service 1920 may be commutatively coupled via an internet connection to functions in cloud 1930 that may comprise security gateway 1932, data center 1934, cloud controller 1936, data storage 1938 and provisioning tool 1940. The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A micro-electrical-mechanical (MEMS) temperature sensor, comprising:
   a cavity wafer configured with an air cavity region, wherein the air cavity region is defined by cavity sides and a bottom surface;
   a metal layer located on the bottom surface of the air cavity region;
   a membrane wafer located over the cavity wafer, wherein the membrane wafer is configured with:
      a microbeam, the microbeam having a first end and a second end, wherein the microbeam is located over the air cavity region;
      a first anchor attached to the first end;
      a second anchor attached to the second end;
      a drive electrode located on a substrate on a first side of the microbeam near the first end;
      a sense electrode located on the substrate at a second side of the microbeam near the second end;
      a first ground electrode adjacent to the drive electrode on the first side near the second end;
      a second ground electrode adjacent to the sense electrode on the second side near the first end;
      a first metallic feed line connected at a first terminal to the drive electrode and at a second terminal to a first side electrode pad;
      a second metallic feed line connected at a first terminal to the first anchor and at a second terminal to a second side electrode pad;
      a third metallic feed line connected at a first terminal to the second ground electrode and at a second terminal to a third side electrode pad;
      a fourth metallic feed line connected to a fourth side electrode pad;
      a fifth metallic feed line connected at a first terminal to the sense electrode and at a second terminal to a fifth side electrode pad;
      a sixth metallic feed line connected at a first terminal to the second anchor and at a second terminal to a sixth side electrode pad;
      a seventh metallic feed line connected at the first terminal to the second ground electrode and at a second terminal to a seventh side electrode pad;
      wherein each of the side electrode pads are adjacent to one another and parallel to the microbeam;
   a capping wafer located over and encapsulating the cavity wafer and membrane wafer, wherein the side electrode pads are exposed;
   an aluminum layer configured to cover a periphery of the MEMS temperature sensor, while leaving the side electrode pads exposed;
   an alternating current (AC) source connected to the first side electrode pad;
   a DC bias voltage source connected to the second side electrode pad;
   a ground connected to the third side electrode pad, the fourth side electrode pad, the sixth side electrode pad and the seventh side electrode pad;
   wherein the microbeam is configured to vibrate at a resonant frequency related to a temperature surrounding the MEMS temperature sensor when an AC current is applied to the drive electrode and a DC bias voltage is applied to the first anchor, wherein the sense electrode is configured to capacitively sense the vibration and generate an induced current based on the resonant frequency;
   a multimeter connected to the fifth side electrode pad, wherein the multimeter is configured to measure the induced current; and
   a computing device connected to the multimeter, wherein the computing device is configured with a display and a database including records relating induced current values to temperature values, wherein the computing device is configured to search the database to match the induced current to a temperature value and display the temperature value on the display.

2. The MEMS temperature sensor of claim 1, further comprising:
   a substrate located below the cavity wafer, wherein the substrate is connected to the fourth side electrode pad.

3. The MEMS temperature sensor of claim 2, wherein the aluminum layer is connected to the fourth side electrode pad.

4. The MEMS temperature sensor of claim 1, wherein the microbeam has a length of about 300 microns, a width of about 2 microns and a thickness of about 30 microns.

5. The MEMS temperature sensor of claim 1, wherein the air cavity region is about 50 microns deep.

6. The MEMS temperature sensor of claim 1, wherein each of the drive electrode, the sense electrode, the first ground electrode and the second ground electrode are spaced about 2 microns from the microbeam and from each other.

7. The MEMS temperature sensor of claim 1, wherein a relationship between the induced current and the temperature is linear within a temperature range of about 30 degree Celsius to 60 degree Celsius.

8. The MEMS temperature sensor of claim 7, wherein the resonant frequency is inversely proportional to the temperature.

9. The MEMS temperature sensor of claim 8, wherein the DC bias voltage is about 20 volts and the AC current is about −32 dBm and has a fixed frequency.

10. The MEMS temperature sensor of claim 1, wherein dimensions of the encapsulated MEMS temperature sensor are a length about 3 mm, a width of about 2 mm and a height of about 1 mm.

11. The MEMS temperature sensor of claim 1, further comprising:
 a rectangular wall located on the membrane wafer, wherein the rectangular wall is configured to surround the microbeam, the first and second anchors, the drive electrode, the sense electrode, the first ground electrode and the second ground electrode, wherein a portion of the rectangular wall adjacent to the first side electrode pad, the second side electrode pad, the third side electrode pad, the fourth side electrode pad, the fifth side electrode pad, the sixth side electrode pad and the seventh side electrode pad includes a plurality of vias configured to pass the first metallic feed line, the second metallic feed line, the third metallic feed line and the fourth metallic feedline respectively through the portion of the rectangular wall.

12. The MEMS temperature sensor of claim 11, wherein the capping wafer is configured to vacuum encapsulate the rectangular wall and the membrane wafer.

13. The MEMS temperature sensor of claim 11, wherein the rectangular wall is etched from a layer of silicon dioxide deposited on the membrane wafer before the membrane wafer is configured.

14. A method of using a micro-electrical-mechanical (MEMS) temperature sensor, comprising:
 applying, by an alternating current (AC) source, a fixed frequency alternating current to a drive electrode;
 applying, by a DC bias voltage source, a DC bias voltage to a first anchor of a microbeam;
 connecting a ground to a second anchor of the microbeam, to a first ground electrode adjacent to the drive electrode, to a second ground electrode adjacent to a sense electrode, to a substrate of the MEMS temperature sensor and to an aluminum layer encapsulating the MEMS temperature sensor;
 measuring, by a multimeter, an induced current at the sense electrode over a frequency range;
 receiving, by a computing device connected to the multimeter, the induced current;
 determining, by the computing device, a resonant frequency of the induced current based on a magnitude of the induced current;
 searching, by the computing device, a database containing records induced current values at each resonant frequency to temperature values;
 matching the induced current and determined resonant frequency to a temperature value; and
 displaying, on a display, the temperature value.

15. The method of claim 14, wherein temperature values within a temperature range of about 30 degree Celsius to 60 degree Celsius are linearly related to the induced current.

16. The method of claim 14, applying, by the DC bias voltage source, the DC bias voltage at about 20 volts and applying, by the AC source, the fixed frequency alternating current at about −32 dBm.

17. A method of making a micro-electrical-mechanical (MEMS) temperature sensor, comprising:
 depositing a cavity wafer on a substrate;
 etching, by lithographic etching, an air cavity region into the cavity wafer, wherein the air cavity region is defined by cavity sides and a bottom surface;
 masking and depositing, by electronic vapor deposition, a metal on the bottom surface;
 removing the mask;
 depositing a membrane wafer on the cavity wafer;
 depositing a layer of silicon dioxide over the membrane wafer;
 performing an isotropic etch process to form rectangular walls around an area of the membrane wafer while masking the membrane wafer;
 forming, by lithographic etching, a microbeam in the membrane wafer over the air cavity region;
 forming, by etching, a first anchor at a first end of the microbeam and a second anchor at a second end of the microbeam;
 forming a masking pattern over the membrane wafer;
 depositing, by electronic vapor deposition of aluminum, a drive electrode on a first side of the microbeam, a first ground electrode on the first side of the microbeam, a sense electrode on a second side of the microbeam, a second ground electrode on the second side of the microbeam, a first anchor electrode on the first anchor, and a second anchor electrode on the second anchor;
 depositing, by electronic vapor deposition of aluminum, a plurality of side electrode pads in a region of the membrane wafer which is outside of the rectangular walls;
 depositing, by electronic vapor deposition of aluminum, a wiring pattern of metallic feed lines on the membrane wafer within the area surrounding the rectangular walls, wherein the metallic feed lines are configured to connect each of the drive electrode, the first ground electrode, the sense electrode, the second ground electrode, the first anchor electrode, and the second anchor electrode to a respective side electrode pad;
 removing the masking pattern;
 encapsulating rectangular walls, the membrane wafer and the cavity wafer with a capping wafer, while masking the side electrode pads;
 encapsulating the capping wafer with an aluminum layer; and
 removing the masking from the side electrode pads.

18. The method of claim 17, further comprising:
 connecting an alternating current (AC) source to a first side electrode pad connected by a first metallic feed line to the drive electrode of the plurality of side electrode pads;
 connecting a DC bias voltage source to a second side electrode pad;
 connecting a ground to a third side electrode pad and a fourth side electrode pad;
 connecting a multimeter to a fifth side electrode pad, wherein the multimeter is configured to measure an induced current over a frequency when the AC source and the DC bias voltage source are turned ON; and
 connecting the ground to a sixth side electrode pad and to a seventh side electrode pad.

19. The method of claim 18, further comprising:
connecting a computing device to the multimeter, wherein the computing device is configured for:
receiving the induced current,
determining a resonant frequency of the induced current based on a magnitude of the induced current;
searching a database containing records induced current values at each resonant frequency to temperature values;
matching the induced current and determined resonant frequency to a temperature value; and
displaying, on a display, the temperature value.

20. The method of claim 19, further comprising:
linearly relating the temperature values to the induced current within a temperature range of about 30 degrees Celsius to 60 degrees Celsius.

* * * * *